(12) United States Patent
Kwon et al.

(10) Patent No.: US 8,133,757 B2
(45) Date of Patent: Mar. 13, 2012

(54) METHOD OF MANUFACTURING A PHASE CHANGEABLE MEMORY UNIT HAVING AN ENHANCED STRUCTURE TO REDUCE A RESET CURRENT

(75) Inventors: Hyun-Suk Kwon, Seoul (KR);
Young-Soo Lim, Cheongju-si (KR);
Sung-Un Kwon, Jeonju-si (KR);
Yong-Ho Ha, Hwaseong-si (KR);
Jeong-Hee Park, Hwaseong-si (KR);
Joon-Sang Park, Seoul (KR);
Myung-Jin Kang, Suwon-si (KR);
Doo-Hwan Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 169 days.

(21) Appl. No.: 12/592,816

(22) Filed: Dec. 3, 2009

(65) Prior Publication Data
US 2010/0144135 A1    Jun. 10, 2010

(30) Foreign Application Priority Data

Dec. 4, 2008 (KR) ........................ 10-2008-0122316

(51) Int. Cl.
*H01L 29/02* (2006.01)
(52) U.S. Cl. .............. 438/102; 257/2; 257/3; 257/4; 257/773; 257/E29.002; 438/103; 365/163

(58) Field of Classification Search ................. 257/773, 257/2–5, E29.002; 438/102–103; 365/163
See application file for complete search history.

(56) References Cited

U.S. PATENT DOCUMENTS

| 7,473,597 B2 | 1/2009 | Lee et al. |
| 2003/0122166 A1* | 7/2003 | Lai .............................. 257/246 |
| 2006/0040485 A1 | 2/2006 | Lee et al. |
| 2007/0008774 A1 | 1/2007 | Khang |
| 2007/0164267 A1 | 7/2007 | Asano et al. |

FOREIGN PATENT DOCUMENTS

| KR | 10-0653701 B1 | 11/2006 |
| KR | 10-0682948 B1 | 2/2007 |

* cited by examiner

*Primary Examiner* — Jenny L Wagner
*Assistant Examiner* — Jami M Valentine
(74) *Attorney, Agent, or Firm* — Onello & Mello, LLP

(57) ABSTRACT

A phase changeable memory unit includes a lower electrode, an insulating interlayer structure having an opening, a phase changeable material layer and an upper electrode. The lower electrode is formed on a substrate. The insulating interlayer structure has an opening and is formed on the lower electrode and the substrate. The opening exposes the lower electrode and has a width gradually decreasing downward. The phase changeable material layer fills the opening and partially covers an upper face of the insulating interlayer structure. The upper electrode is formed on the phase changeable material layer.

9 Claims, 20 Drawing Sheets

METHOD OF MANUFACTURING A PHASE CHANGEABLE MEMORY UNIT HAVING AN ENHANCED STRUCTURE TO REDUCE A RESET CURRENT

CROSS-REFERENCE TO RELATED APPLICATIONS

This application claims the benefit of Korean Patent Application No. 10-2008-0122316 filed on Dec. 4, 2008 in the Korean Intellectual Property Office, the contents of which are herein incorporated by reference in their entirety.

BACKGROUND

1. Field

Exemplary embodiments relate to a phase changeable memory unit, a method of manufacturing a phase changeable memory unit and a method of manufacturing a phase changeable memory device. More particularly, exemplary embodiments relate to a phase changeable memory unit having an enhanced structure, a method of manufacturing a phase changeable memory unit having an enhanced structure and a method of manufacturing a phase changeable memory device having an enhanced structure.

2. Description of the Related Art

Generally, a phase changeable memory device (PRAM) stores data by using a difference in resistance between two states, namely, an amorphous state and a crystalline structure state, of a chalcogenide material which forms a phase changeable material. Namely, the phase changeable memory device stores data "0" or "1" with a reversible phase transition of a phase changeable material including a chalcogenide material. The crystalline structure and the amorphous state of a chalcogenide material have dramatically different electric resistivity, which is a basis of storing data. The reversible phase transition is generated by a magnitude and/or wave length of pulse applied to the phase changeable material. For example, the amorphous state has a high resistance used to represent a binary "0" and the crystalline structure has a low resistance state used to represent a binary "1." A reset current transforming the phase changeable material into the amorphous state and a set current transforming the phase changeable material into the crystalline structure are delivered to the phase changeable material through a transistor or a diode on a substrate.

A confined structure in which a fine via hole exposing a lower electrode is filled with a phase changeable material to reduce a contact area of the phase changeable material and the lower electrode has been developed in order to reduce the set current and the reset current. A diameter of the via hole has been decreased, for example, to under about 50 nm, in order to enhance integration degree of the PRAM. However, when the via hole has a small diameter, it is not easy to fill the via hole.

SUMMARY

Exemplary embodiments provide a phase changeable memory unit.

Exemplary embodiments provide a method of manufacturing a phase changeable memory unit.

Exemplary embodiments provide a method of manufacturing a phase changeable memory device.

According to one aspect of an exemplary embodiment, a phase changeable memory unit includes a lower electrode, an insulating interlayer structure, a phase changeable material layer and an upper electrode. The lower electrode is formed on a substrate. The insulating interlayer structure having an opening is formed on the lower electrode and the substrate. The opening exposes the lower electrode and has a width gradually decreasing downward. The phase changeable material layer fills the opening and partially covers an upper face of the insulating interlayer structure. The upper electrode is formed on the phase changeable material layer.

In an exemplary embodiment, the phase changeable material layer includes a program region where a phase transition occurs and an insulation region thermally insulating the program region from outside by enclosing the program region. In one embodiment, the program region is only formed in the opening.

In an exemplary embodiment, a central portion of the phase changeable layer is located at a level lower than that of an edge portion of the phase changeable layer.

According to one aspect of another exemplary embodiment, there is provided a method of manufacturing the phase changeable memory unit. A lower electrode is formed on a substrate. An insulating interlayer structure having an opening is formed on the lower electrode and the substrate. The opening exposes the lower electrode. A phase changeable material layer fills the opening and partially covers an upper face of the insulating interlayer structure. An upper electrode is formed on the phase changeable material layer.

In an exemplary embodiment, filling the opening with the phase changeable material layer includes: forming a first phase changeable material layer having a uniform thickness along a surface of the insulating interlayer structure and a surface and a sidewall of the opening, planarizing the first phase changeable material layer to form a second phase changeable material layer until the upper face of the insulating interlayer structure is exposed, removing an upper portion of the second phase changeable material layer and forming a third phase changeable material layer on the second phase changeable material layer.

In an exemplary embodiment, filling the opening with the phase changeable material layer includes forming a first phase changeable material layer in the opening and on the insulating interlayer structure, planarizing the first phase changeable material layer to form a second phase changeable material layer until the upper face of the insulating interlayer structure is exposed, removing an upper portion of the second phase changeable material layer, and forming a third phase changeable material layer on the second phase changeable material layer.

In an exemplary embodiment, forming the first phase changeable material layer includes a physical vapor deposition process.

In an exemplary embodiment, removing the upper portion of the second phase changeable material layer includes an RF etching process using an argon gas.

In an exemplary embodiment, planarizing the first phase changeable material layer damages the upper portion of the second phase changeable material layer and removing an upper portion of the second phase changeable material layer removes the damaged upper portion In an exemplary embodiment, removing the upper portion of the second phase changeable material layer removes about 100 Å to about 200 Å of the upper portion of the second phase changeable material layer.

In an exemplary embodiment, forming the third phase changeable material layer includes a physical vapor deposition process which forms the third phase changeable material layer on the second phase changeable material layer and the insulating interlayer structure.

In an exemplary embodiment, the opening has a width gradually decreasing downward.

According to one aspect of an exemplary embodiment, there is provided a method of manufacturing a phase changeable memory device. A lower structure having an impurity region is formed on a substrate. An insulating interlayer having a first opening is formed on the lower structure and the substrate. The opening exposes the impurity region. A lower electrode electrically connected to the impurity region is formed in the first opening. An insulating interlayer structure is formed on the insulating interlayer and the lower electrode. A second opening exposing the lower electrode is formed through the insulating interlayer structure. A second opening is filled with a first phase changeable material layer to partially cover an upper face of the insulating interlayer structure. The first phase changeable material layer is planarized to form a second phase changeable material layer until the insulating interlayer structure is exposed. An upper portion of the second phase changeable material layer is removed. A third phase changeable material layer is formed on the second phase changeable material layer. An upper electrode layer is formed on the third phase changeable material layer. The upper electrode layer, the third phase changeable material layer and the second phase changeable material layer are patterned to form a phase changeable memory unit.

According to an exemplary embodiment of the present inventive concept, a phase changeable memory unit has a phase changeable material layer having a better property, so that current for converting a state of the phase changeable material layer is reduced. Accordingly, the phase changeable memory unit has good electrical characteristics.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DESCRIPTION OF EMBODIMENTS

Figure 1:
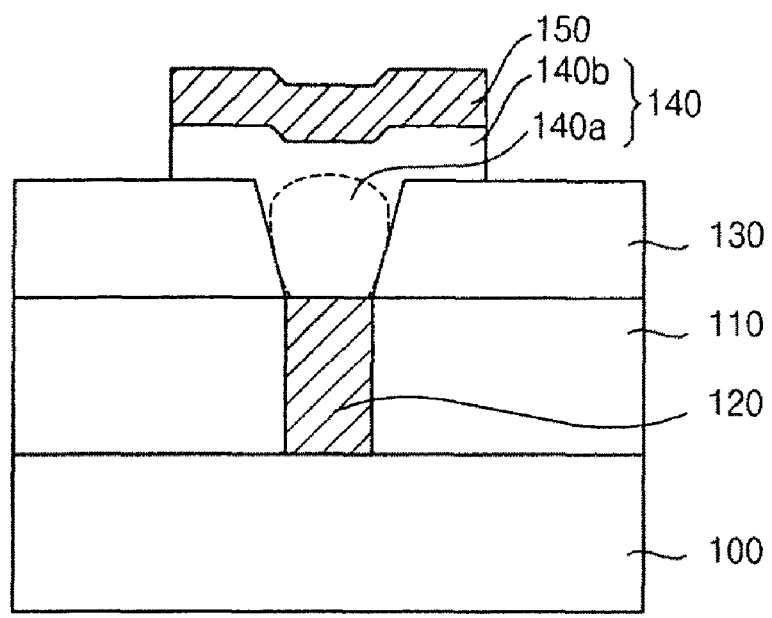
FIG. 1 is a cross-sectional view illustrating a phase changeable memory unit in accordance with exemplary embodiments of the present inventive concept.

Various exemplary embodiments will be described more fully hereinafter with reference to the accompanying drawings, in which some exemplary embodiments are illustrated. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a phase changeable memory unit in accordance with exemplary embodiments of the present inventive concept.

Referring to FIG. 1, a phase changeable memory unit is formed on a substrate 100. The phase changeable memory unit includes a first insulation layer 110, a lower electrode contact 120, a second insulation layer 130 and a phase changeable layer 140 and an upper electrode 150.

In an exemplary embodiment, the substrate 100 includes a semiconductor substrate such as silicon wafer or silicon on insulator. Alternatively, the substrate 100 includes a metal oxide single crystalline substrate such as an aluminum oxide single crystalline substrate or strontium-titanium oxide single crystalline substrate.

A lower structure (not illustrated) is formed on the substrate 100. The first insulation layer 110 is formed on the substrate 100 to cover the lower structure. For example, the lower structure may have a contact region, a contact, a pad, a plug, a conductive layer pattern, gate structure and/or transistor.

The first insulation layer 110 includes, for example, BPSG (boro-phosphor silicate glass), PSG (phosphor silicate glass), USG (undoped silicate glass), SOG (spin on glass), FOX (flowable oxide), TEOS (tetra ethyl ortho silicate), PE-TEOS (plasma enhanced-TEOS) or HDP-CVD (high density plasma-chemical vapor deposition) oxide. These may be used alone or in combination.

The lower electrode contact 120 is formed through the first insulation layer 110 to electrically contact the lower structure. For example, the lower electrode contact 120 includes, for example, polysilicon doped with impurities or metal of conductive metal nitride. For example, the lower electrode contact 120 includes, for example, tungsten, titanium, aluminum, copper, tantalum, tungsten nitride, titanium nitride, aluminum nitride, tantalum nitride or titanium aluminum nitride. These may be used alone or in combination.

The second insulation layer 130 is formed on the first insulation layer 110 and the lower electrode contact 120. An opening exposing the lower electrode contact 120 is formed through the second insulation layer 130. The opening has a width gradually decreasing downward. When the width of the opening gradually decreases downward, a void is not formed in a successive process of filling the opening with the phase changeable material layer 140. In an exemplary embodiment, the second insulation layer 130 includes material substantially the same as the material of the first insulation layer 110. Alternatively, the second insulation layer 130 includes material substantially different from the material of the first insulation layer 110.

The phase changeable material layer 140 fills the opening and extends across an upper face of the second insulation layer 130. In an exemplary embodiment, a portion of the phase changeable material on the second insulation layer 130 has a width larger than that of the opening. The phase changeable material layer 140 includes, for example, a chalcogenide material including, for example, germanium (Ge), antimony (Sb), and/or tellurium (Te). The phase changeable material layer 140 is formed by a physical vapor deposition (PVD) process, a chemical vapor deposition (CVD) process, a sol-gel process, an atomic layer deposition (ALD) process or a cyclic CVD process.

The phase changeable material layer 140 includes a first phase changeable material layer 140a electrically contacting the lower electrode contact 120 and a second phase changeable material layer 140b covering the first phase changeable material layer 140a and extending on the second insulation layer 130. The first phase changeable material layer 140a is enclosed by the second phase changeable material layer 140b, the second insulation layer 130 and the lower electrode contact 120, so that the first phase changeable material layer 140a has a confined structure. In an exemplary embodiment, the first phase changeable material layer 140a is only formed in the opening.

A crystalline structure of the first phase changeable material layer 140a may be transformed by joule's heat generated in an interface between the lower electrode contact 120 and the first phase changeable material layer 140a. For example, the first phase changeable material layer 140a of a crystalline structure is converted into an amorphous state by joule's heat. That is, the first phase changeable material layer 140a may be defined as a region in which a phase transition is generated. Because the first phase changeable material layer 140a is covered by the second phase changeable material layer 140b, the joule's heat is not emitted to the outside and is held in the first phase changeable material layer 140a. Accordingly, the joule's heat is effectively delivered to the first phase changeable material layer 140a. As a result, a reset current is reduced because heat for generating a phase transition is effectively used. Also, the second phase changeable material layer 140b prevents impurities from being diffused into the first phase changeable material layer 140a because the second phase changeable material layer 140b covers the first phase changeable material layer 140a and extends on the second insulation layer 130.

The upper electrode 150 is formed on the phase changeable material layer 140. The upper electrode 150 has a width substantially the same as that of the phase changeable material layer 140. The upper electrode 150 is formed, for example, by a CVD process, a PVD process, an ALD process, a low pressure CVD process, an electron beam deposition process or a pulse layer deposition process. The phase changeable material layer 140 is formed on the second insulation layer 130 to extend over the second insulation layer 130. Accordingly, a contact area where the upper electrode 150 and the phase changeable material layer 140 contact each other is sufficiently formed.

FIGS. 2 through 12 are cross-sectional views illustrating a method of manufacturing a phase changeable memory unit in accordance with FIG. 1.

Figure 2:
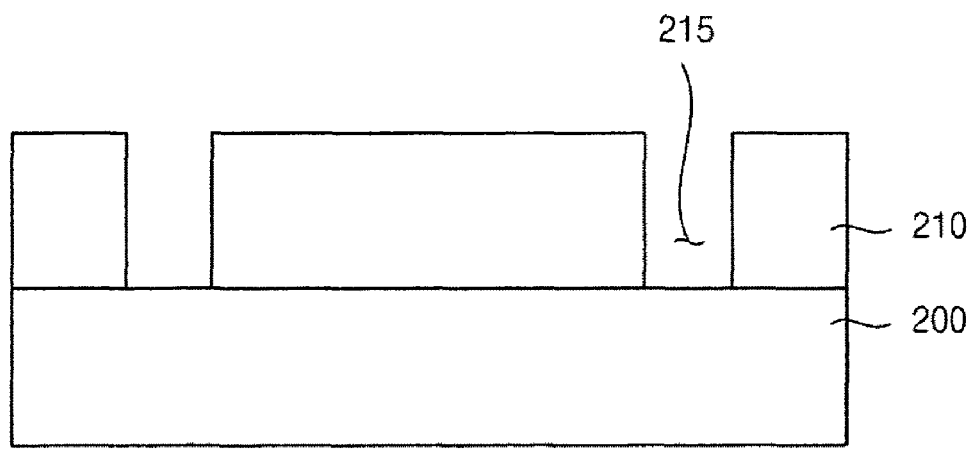
FIGS. 2 through 12 are cross-sectional views illustrating a method of manufacturing a phase changeable memory unit in accordance with FIG. 1.

Referring to FIG. 2, a lower structure is formed on a substrate 200. The substrate 200 includes a semiconductor substrate such as silicon wafer or silicon on insulator. Alternatively, the substrate 200 includes a metal oxide single crystalline substrate such as an aluminum oxide single crystalline substrate or strontium-titanium oxide single crystalline substrate. For example, the lower structure may have a contact region, a contact, a pad, a plug, a conductive layer pattern, gate structure and/or transistor.

A first insulation layer 210 is formed on the substrate 200 to cover the lower structure. The first insulation layer 210 has a sufficient height from the substrate 200, so that the lower structure is not exposed. The first insulation layer 210 includes, for example, BPSG (boro-phosphor silicate glass), PSG (phosphor silicate glass), USG (undoped silicate glass), SOG (spin on glass), FOX (flowable oxide), TEOS (tetra ethyl ortho silicate), PE-TEOS (plasma enhanced-TEOS) or HDP-CVD (high density plasma-chemical vapor deposition) oxide. These may be used alone or in combination. The first insulation layer 210 is formed, for example, by a LPCVD process, a CVD process, plasma enhanced chemical vapor deposition (PECVD) process or HDP-CVD process.

A first photoresist pattern (not illustrated) is formed on the first insulation layer 210. The first insulation layer 210 is partially etched using the first photoresist pattern as an etching mask to form a contact hole 215 exposing the lower structure. For example, the contact hole 215 may expose a contact region on the substrate 200. The first photoresist pattern is removed, for example, by an ashing process and/or a strip process after forming the contact hole 215.

Figure 3:
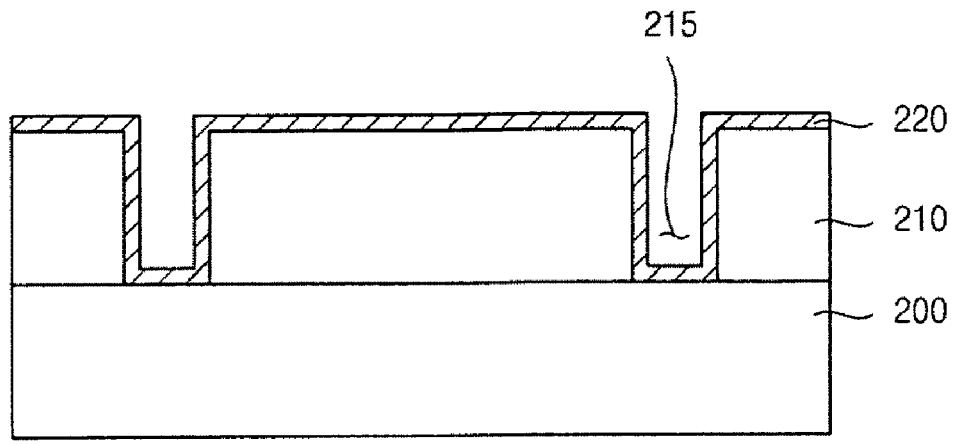

Referring to FIG. 3, a lower electrode layer 220 having a uniform thickness is formed on the exposed lower structure and the first insulation layer 210 and along a sidewall of the contact hole 215. The lower electrode layer 220 includes, for example, a metal layer and metal nitride sequentially formed.

Figure 4:
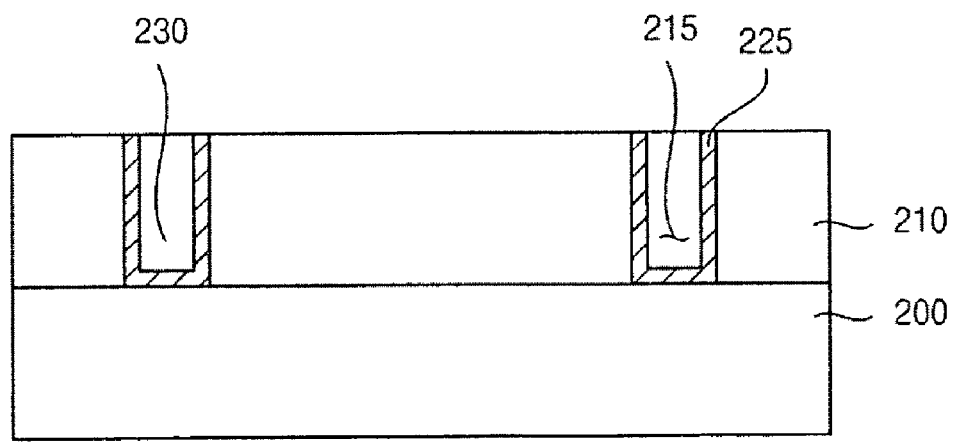

Referring to FIG. 4, the contact hole 215 is filled with a filling layer (not illustrated). The filling layer is formed on the lower electrode layer 220. The filling layer includes, for example, silicon nitride or silicon oxide. For example, the filling layer is formed using a material substantially the same as the first insulation layer 210. The filling layer and the lower electrode layer 220 are partially removed to exposes an upper surface of the first insulation layer 210. Accordingly, a lower electrode 225 and a filling layer pattern 230 filling the contact hole 215 are formed. The filling layer and the lower electrode layer 220 are removed, for example, by a CMP process. The lower electrode 225 may have a column shape having a cavity therein or a ring shape.

Figure 5:
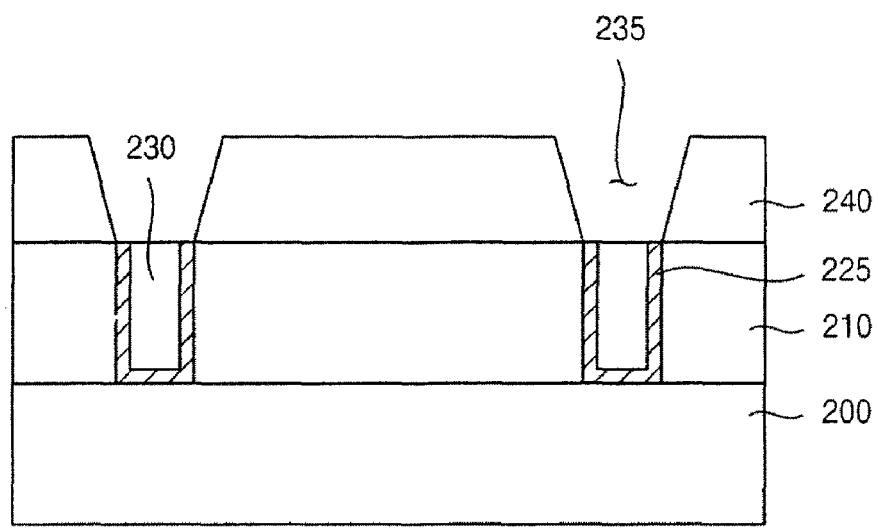

Referring to FIG. 5, a mold layer (not illustrated) is formed on the first insulation layer 210, the lower electrode 225 and the filling layer pattern 230. The mold layer is formed, for example, using a silicon oxide, silicon nitride or silicon oxynitride. The mold layer is patterned to form a mold layer pattern 240 having an opening 235 exposing the filling layer pattern 230 and the lower electrode 225. The opening 235 is formed, for example, by a photolithography process or an etching process. The opening 235 has a width gradually decreasing downward.

Figure 6:
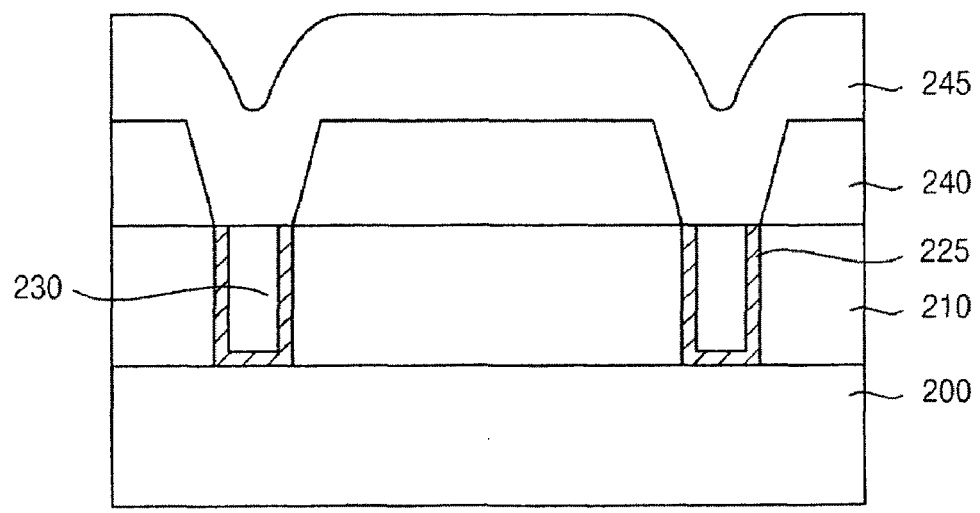

Referring to FIG. 6, a first preliminary phase changeable layer 245 is formed in the opening 235 and on the mold layer pattern 240. The first preliminary phase changeable layer 245 is formed, for example, using a chalcogenide material including, for example, germanium (Ge), antimony (Sb), and/or tellurium (Te). The first preliminary phase changeable layer 245 is formed by a physical vapor deposition (PVD) process, a chemical vapor deposition (CVD) process, a sol-gel process, a atomic layer deposition (ALD) process or a cyclic CVD process.

In an exemplary embodiment, the first preliminary phase changeable layer 245 is formed by a PVD process. When the first preliminary phase changeable layer 245 is formed by a PVD process, the first preliminary phase changeable layer 245 has a property better than that formed by a CVD process or an ALD process. The PVD process deposits material on or in a target without chemical reactions, while the CVD process and the ALD process use chemical reactions for deposition. However, when the first preliminary phase changeable layer 245 is formed by the PVD process in an opening having a sidewall perpendicular to the substrate 200, an overhang is formed at a corner portion where an upper surface of the mold layer pattern 240 and a sidewall of the opening 235 contact each other. Accordingly, a void enclosed by the first preliminary phase changeable layer 245 is formed in the opening 235.

In an exemplary embodiment, because the opening 235 has a width gradually decreasing downward, a void is not formed in the opening 235, even when the first preliminary phase changeable layer is formed by a PVD process.

Figure 7:
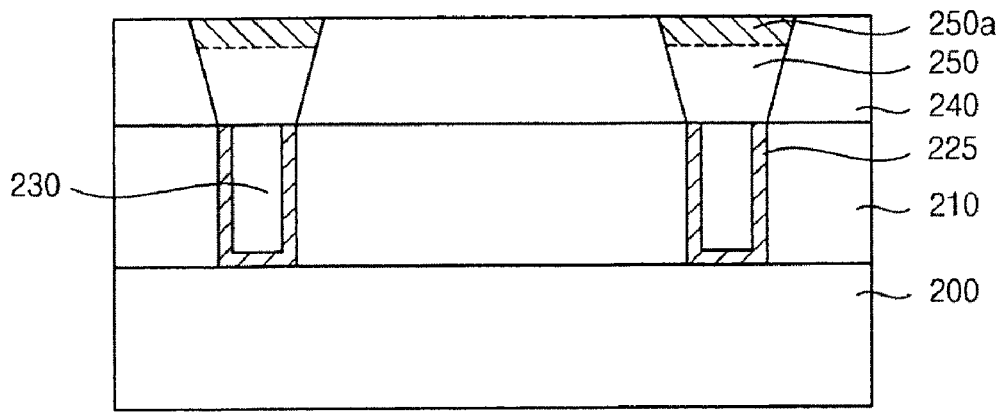

Referring to FIG. 7, an upper portion of the first preliminary phase changeable layer 245 is removed to expose the mold layer pattern 240. Accordingly, a second preliminary phase changeable layer 250 filling the opening 235 is formed in the opening 235. For example, the second preliminary phase changeable layer 250 is formed in the opening 235 by a CMP process. The second preliminary phase changeable layer 250 has an upper damaged portion 250a generated by the CMP process. For example, chemical materials used in the CMP process may penetrate into an upper portion of a second preliminary phase changeable layer 250 or a polishing agent may give physical damages to the upper portion of a second preliminary phase changeable layer 250 in the CMP process, so that the upper damaged portion 250a is formed. For example, the upper damaged portion 250a may have a depth in a range of about 50 Å to about 100 Å. The upper damaged portion 250a deteriorates performance of a device.

Figure 8:
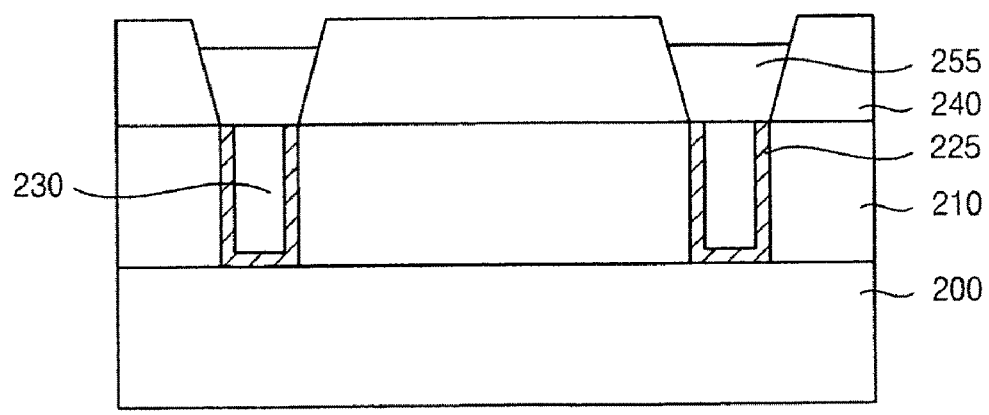

Referring to FIG. 8, the upper damaged portion 250a is removed from the second preliminary phase changeable layer 250 to form a third preliminary phase changeable layer 255. The removal process includes, for example, a dry etching process using plasma. For example, the removal process includes a capacitive coupled plasma (CCP) process, an inductively coupled plasma (ICP) process, a reactive ion etch (RIE) process or an electron cyclotron resonance (ECR) process. In an example embodiment, the upper damaged portion 250a is removed by an etching process using RF power.

In an exemplary embodiment, argon gas is injected into a chamber and then the RF power is applied to ionize the argon gas. The argon ion collides against the upper damaged portion 250a, so that the upper damaged portion 250a is removed. The removal depth is consistent regardless of a substantial depth of the upper damaged portion 250a. For example, the removal depth may be about 100 Å to 200 Å. When the second preliminary phase changeable layer 250 is excessively etched, etch residue excessively remains in the chamber. Accordingly, the etch residue generates undesirable problems in a successive process. Alternatively, the removal depth is the same as that of the upper damaged portion 250a.

Figure 9:
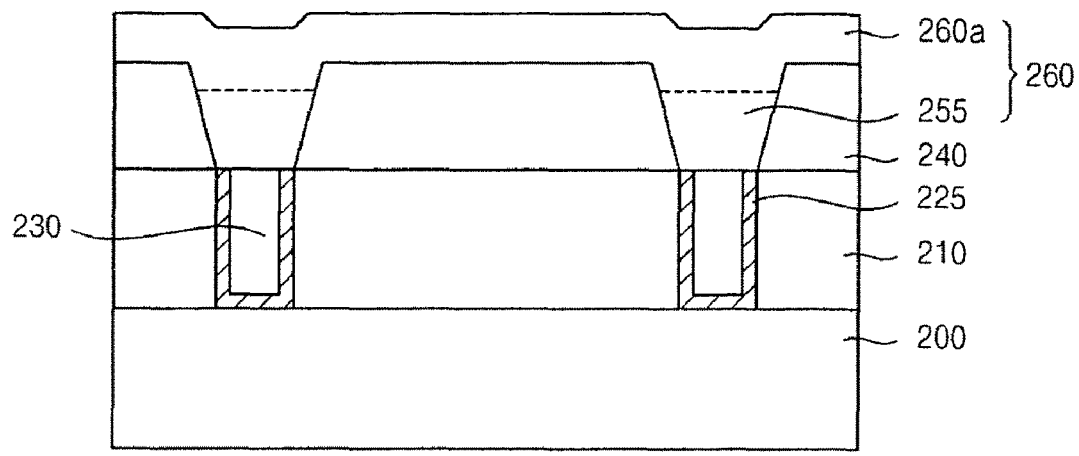

Referring to FIG. 9, a fourth preliminary phase changeable layer 260a is formed on the third preliminary phase changeable layer 255 and the mold layer pattern 240. Accordingly, a phase changeable layer 260 is formed. In an exemplary embodiment, a central portion of the phase changeable layer 260 is located at a level lower than that of an edge portion of the phase changeable layer 260.

The fourth preliminary phase changeable layer 260a is formed, for example, using a chalcogenide material including, for example, germanium (Ge), antimony (Sb), and/or tellurium (Te). The fourth preliminary phase changeable layer 260a is formed, for example, by a physical vapor deposition (PVD) process, a chemical vapor deposition (CVD) process, a sol-gel process, an atomic layer deposition (ALD) process or a cyclic CVD process. In one embodiment, the fourth preliminary phase changeable layer 260a is formed using material substantially the same as the third preliminary phase changeable layer 255. Alternatively, the fourth preliminary phase changeable layer 260a is formed using material different from the third preliminary phase changeable layer 255.

In an exemplary embodiment, the fourth preliminary phase changeable layer 260a is formed by a PVD process using material substantially the same as the third preliminary phase changeable layer 255. Also, in one exemplary embodiment, an interface does not exist between the fourth preliminary phase changeable layer 260a and the third preliminary phase changeable layer 255. Accordingly, in this embodiment, the phase changeable layer 260 is a single body.

The fourth preliminary phase changeable layer 260a prevents heat from being emitted from an area of the phase changeable layer 260 where a phase transition occurs to the outside. When the upper damaged portion 250a is removed and the fourth preliminary phase changeable layer 260a is not formed on the third preliminary phase changeable layer 255, the area of the phase changeable layer 260 where a phase transition occurs (hereinafter, a program area) and an enclosing portion enclosing the program area has decreased volume. As a result, joule's heat converting states of the phase changeable layer 260 is quickly emitted to the outside, so that a reset current is increased. Meanwhile, in an exemplary embodiment, the fourth preliminary phase changeable layer 260a is formed on the upper damaged portion 250a to obtain a sufficient volume of an insulation region insulating heat of the program region. For example, the program region is only formed in the opening.

Accordingly, when a phase transition occurs in the program region, heat is not emitted to the outside and is held in the phase changeable layer 260, so that a reset current is reduced.

Figure 10:
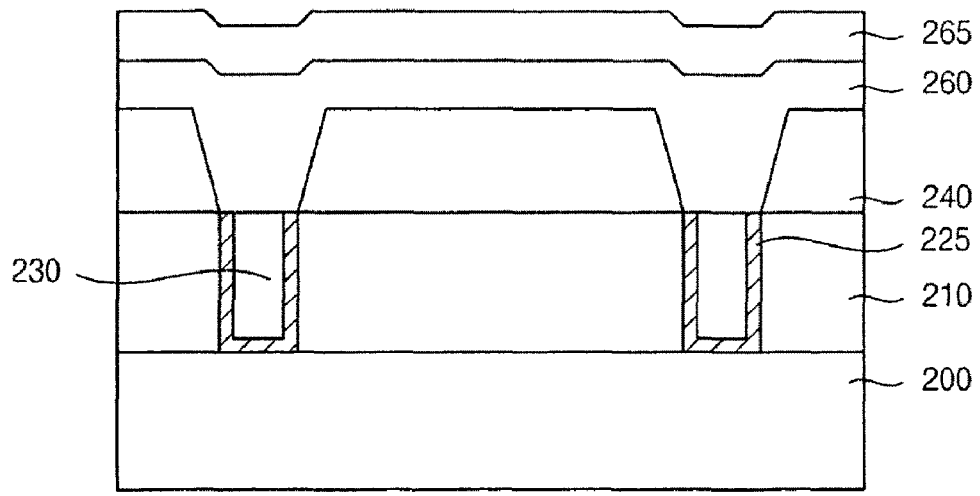

Referring to FIG. 10, an upper electrode layer 265 is formed on the phase changeable layer 260. The upper electrode layer 265 is formed, for example, using metal and/or conductive metal nitride by a sputtering process, a CVD process, a PECVD process, an ALD process or a PLD process. For example, the upper electrode layer 265 includes titanium, nickel, zirconium, molybdenum, ruthenium, palladium, hafnium, tantalum, iridium, platinum, titanium nitride, nickel nitride, zirconium nitride, molybdenum nitride, ruthenium nitride, palladium nitride, hafnium nitride, tantalum nitride, iridium nitride, platinum nitride, tungsten nitride, aluminum nitride, niobium nitride, titanium silicon nitride, titanium aluminum nitride, titanium boron nitride, zirconium silicon nitride, molybdenum aluminum nitride, molybdenum silicon nitride, tantalum silicon molybdenum and/or tantalum aluminum nitride. These may be used alone or in combination.

Figure 11:
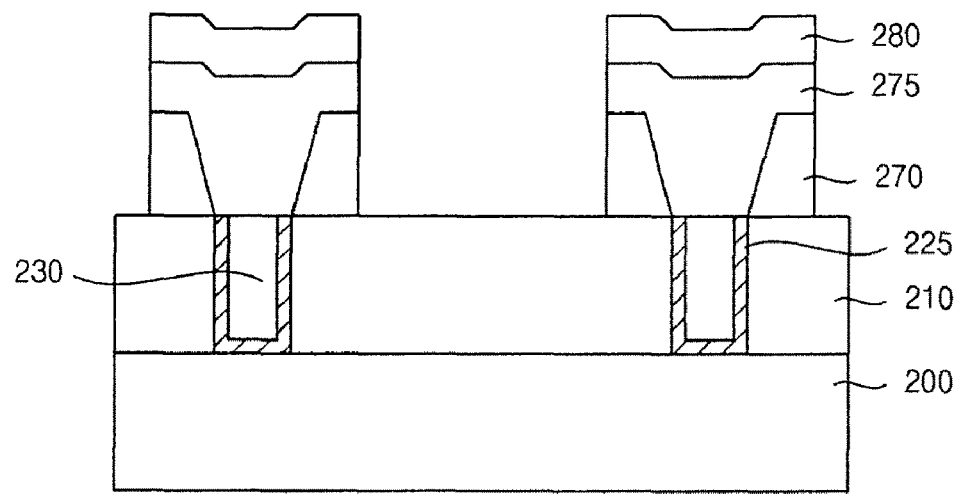

Referring to FIG. 11, the upper electrode layer 265, the phase changeable layer 260 and the mold layer pattern 240 are patterned to form an upper electrode 280, a phase changeable layer pattern 275 and a mold pattern 270.

An upper portion of the phase changeable layer pattern 275 extends across a top surface of the mold pattern 270. The phase changeable layer pattern 275 has an upper portion having a width substantially larger than that of the opening 235. The upper portion prevents impurities from being diffused into the phase changeable layer pattern 275 when the upper electrode layer 265 and the phase changeable layer 260 are patterned.

That is, the phase changeable layer pattern 275 covers a corner portion where the opening 235 and the mold pattern 270 contact each other. Accordingly, an etch margin is enhanced.

Figure 12:
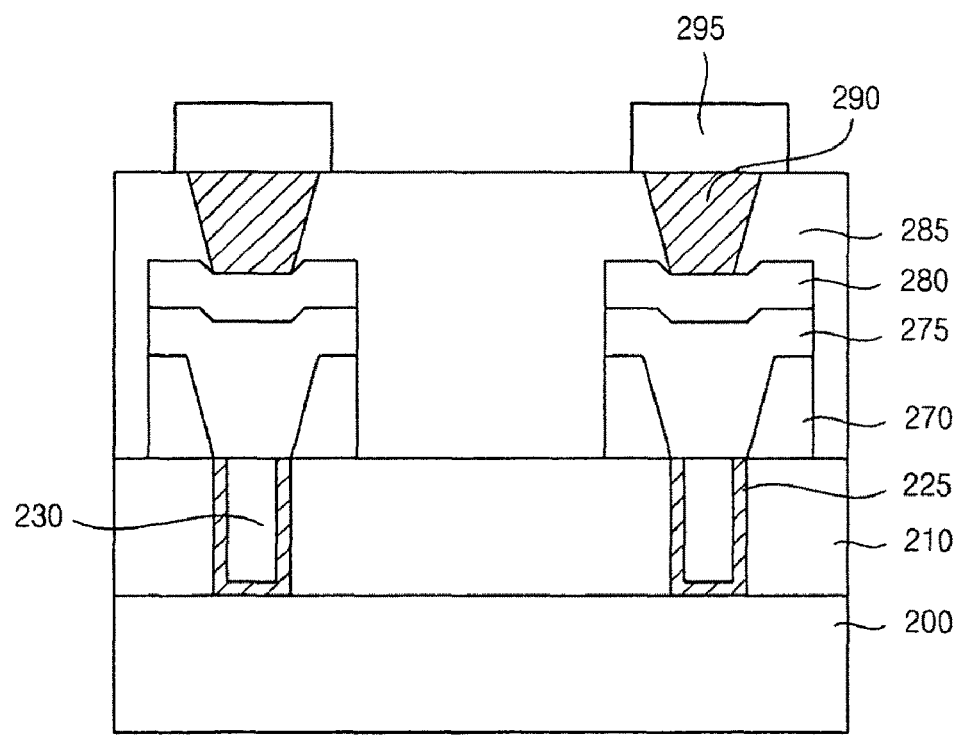

Referring to FIG. 12, an insulating interlayer (not illustrated) is formed to cover the upper electrode 280, the phase changeable layer pattern 275 and the mold pattern 270. The insulating interlayer is formed, for example, using oxide, nitride and/or oxynitride. The insulating interlayer is formed, for example, by a CVD process, a PECVD process, an ALD process, a HDP-CVD process or a LPCVD process.

The insulating interlayer is partially etched to form an insulating interlayer pattern 285. The insulating interlayer pattern 285 includes an upper contact hole exposing the upper electrode 280. The contact hole is filled with an upper contact 290. A wiring 295 is formed on the upper contact 290 and the insulating interlayer pattern 285. The wiring 295 and the upper contact 290 is formed, for example, using metal, conductive metal nitride and/or doped polysilicon. The wiring 295 and the upper contact 290 are formed, for example, by a CVD process, a PECVD process, an ALD process, a HDP-CVD process or a LPCVD process.

Figure 13:
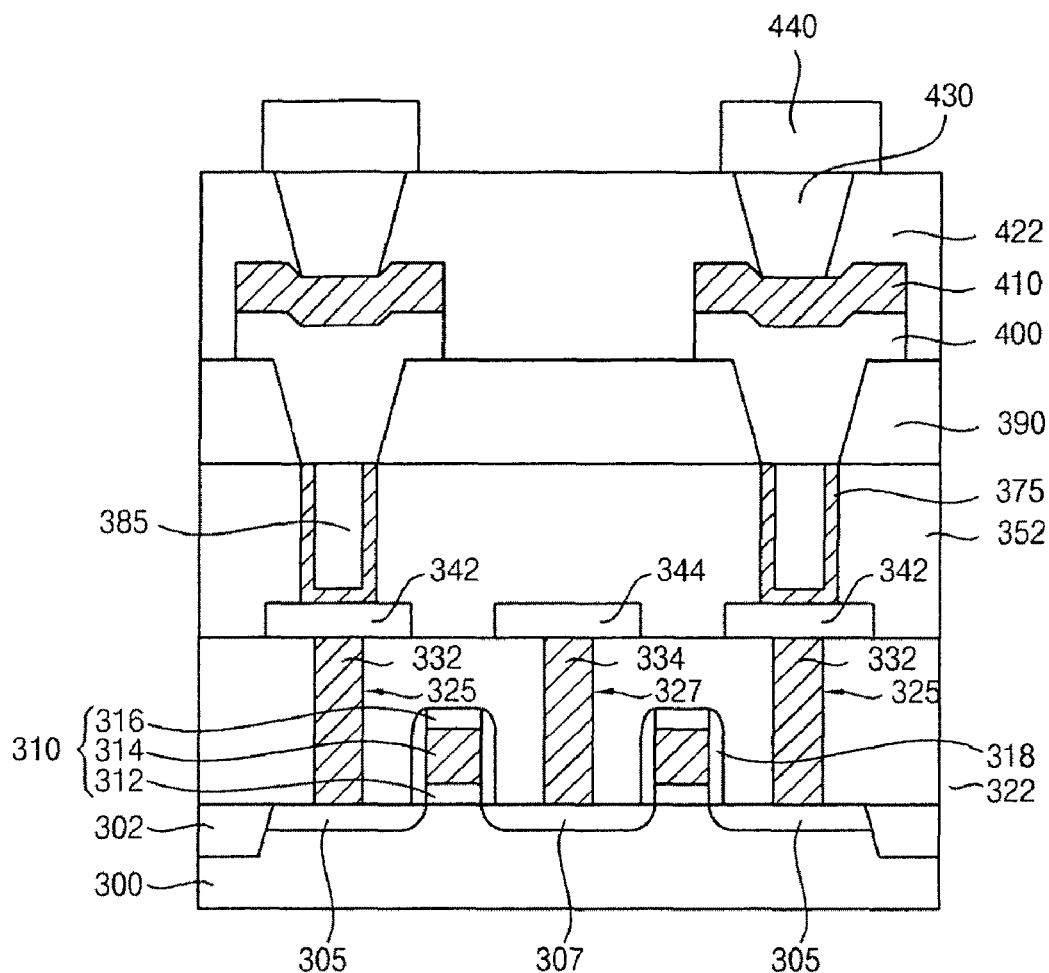
FIG. 13 is a cross-sectional view illustrating a phase changeable memory device in accordance with exemplary embodiments of the present inventive concept.

FIG. 13 is a cross-sectional view illustrating a phase changeable memory device in accordance with exemplary embodiments of the present inventive concept. The phase changeable memory device illustrated in FIG. 13 includes a phase changeable memory unit substantially the same as that described with reference to FIG. 1.

Referring to FIG. 13, the phase changeable memory device includes a gate structure 310, a transistor having a first impurity region 305 and a second impurity region 307, a phase changeable layer pattern 400, an upper electrode 410, a first wiring 344 and a second wiring 440.

The gate structure 310 is formed on the substrate 300. The substrate 300 includes an active region and an isolation layer 302. The gate structure 310 is formed on the active region. The isolation layer 302 may include oxide.

The gate structure 310 includes a gate insulation layer pattern 312 on the active region, a gate electrode and a gate mask 316. The gate structure 310 may further include a gate spacer 318.

The gate insulation layer pattern 312 includes, for example, silicon oxide or metal oxide. The gate electrode 314 includes, for example, doped polysilicon, metal and/or metal silicide. The gate mask 316 and the gate spacer 318 include, for example, silicon nitride or silicon oxynitride.

The first and second impurity regions 305 and 307 are formed in the active region between the gate structures. The first and second impurity regions 305 and 307 may correspond to a source region and a drain region, respectively.

The first insulating interlayer 322 is formed on the substrate to cover the gate structure 310. The first insulating interlayer 322 includes, for example, BPSG (boro-phosphor silicate glass), PSG (phosphor silicate glass), USG (undoped silicate glass), SOG (spin on glass), FOX (flowable oxide), TEOS (tetra ethyl ortho silicate), PE-TEOS (plasma enhanced-TEOS) or HDP-CVD (high density plasma-chemical vapor deposition) oxide.

A first opening 325 and a second opening 327 exposing the first and second impurity regions 305 and 307, respectively, are formed through the first insulating interlayer 322. The first opening 325 and the second opening 327 are filled with a first contact 332 and a second contact 334, respectively. The first contact 332 and the second contact 334 include, for example, metal, metal nitride and/or doped polysilicon. For example, the first contact 332 and the second contact 334 include tungsten, aluminum, titanium, copper, tantalum, tungsten nitride, titanium nitride, aluminum nitride, titanium aluminum nitride and/or tantalum nitride.

A pad 342 is formed on the first contact 332 and the first insulating interlayer 322. The first wiring 344 is formed on the second contact 334 and the first insulating interlayer 322. The first wiring 344 may include a bit line. The pad 342 and the first wiring 344 may include the same material. For example, the pad and the first wiring 344 include metal, metal nitride and/or doped polysilicon. For example, the pad 342 and the first wiring 344 include titanium, nickel, zirconium, molybdenum, ruthenium, palladium, hafnium, tantalum, iridium, platinum, titanium nitride, nickel nitride, zirconium nitride, molybdenum nitride, ruthenium nitride, palladium nitride, hafnium nitride, tantalum nitride, iridium nitride, platinum nitride, tungsten nitride, aluminum nitride, niobium nitride, titanium silicon nitride, titanium aluminum nitride, titanium boron nitride, zirconium silicon nitride, molybdenum aluminum nitride, molybdenum silicon nitride, tantalum silicon molybdenum and/or tantalum aluminum nitride. These may be used alone or in combination.

A second insulating interlayer 352 is formed on the first insulating interlayer 322 to cover the pad 342 and the first wring 344. The second insulating interlayer 352 includes, for example, BPSG (boro-phosphor silicate glass), PSG (phosphor silicate glass), USG (undoped silicate glass), SOG (spin on glass), FOX (flowable oxide), TEOS (tetra ethyl ortho silicate), PE-TEOS (plasma enhanced-TEOS) or HDP-CVD (high density plasma-chemical vapor deposition) oxide. A third opening is formed through the second insulating interlayer 352 to expose the pad 342.

A phase changeable memory unit is formed on the pad 342. The phase changeable memory unit includes a lower electrode contact 375, a phase changeable material layer pattern 400 and an upper electrode 410. The lower electrode contact 375 and the upper electrode 410 include, for example, metal and/or conductive metal nitride. The phase changeable material layer pattern 400 includes, for example, a chalcogenide material including, for example, germanium (Ge), antimony (Sb), and/or tellurium (Te). The phase changeable memory unit has a structure substantially the same as that described with reference to FIG. 1. Accordingly, a detailed description is omitted.

A third insulating interlayer 422 is formed on a mold layer pattern 390 to cover the phase changeable material layer pattern 400 and the upper electrode 410. The third insulating interlayer 422 includes, for example, BPSG (boro-phosphor silicate glass), PSG (phosphor silicate glass), USG (undoped silicate glass), SOG (spin on glass), FOX (flowable oxide), TEOS (tetra ethyl ortho silicate), PE-TEOS (plasma enhanced-TEOS) or HDP-CVD (high density plasma-chemical vapor deposition) oxide.

An upper contact hole is formed through the third insulating interlayer 422 to expose the upper electrode 410. The upper contact hole is filled with an upper contact 430. The upper contact 430 is formed on the upper electrode 410.

The second wiring 440 is formed on the upper contact 430 and the third insulating interlayer 422. The second wiring 440 includes, for example, metal and/or metal nitride. For example, the second wiring 440 includes tungsten, titanium, aluminum, copper, tantalum, tungsten nitride, titanium nitride, aluminum nitride, tantalum nitride or titanium aluminum nitride. These may be used alone or in combination. The second wiring 440 is electrically connected to the upper electrode through the upper contact 430.

FIGS. 14 through 25 are cross-sectional views illustrating a phase changeable memory device in accordance with exemplary embodiments of the present inventive concept.

Figure 14:
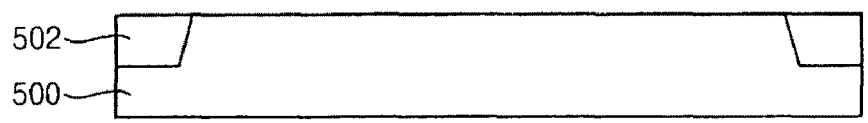
FIGS. 14 through 25 are cross-sectional views illustrating a phase changeable memory device in accordance with exemplary embodiments of the present inventive concept.

Referring to FIG. 14, a substrate 500 includes an active region and an isolation layer 502.

Figure 15:
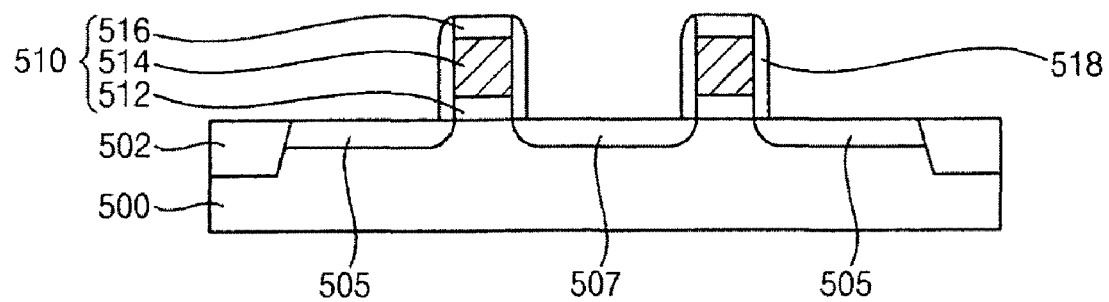

Referring to FIG. 15, a gate insulation layer, a gate conductive layer and a gate mask layer are sequentially formed on the substrate 500. The gate insulation layer, the gate conductive layer and the gate mask layer are patterned to form the gate structure 510 on the active region. The gate structure 510 includes a gate insulation layer pattern 512, a gate electrode 514 and a gate mask 516.

A nitride layer (not illustrated) is formed on the substrate 500 to cover the gate structure 510. The nitride layer is etched to form a gate spacer 518 on a sidewall of the gate structure 510.

Impurities are implanted into the active region adjacent to the gate structure 510 mask to form first and second impurity region 505 and 507 using the gate structure as an ion implantation mask. Accordingly, a transistor having the gate structure 510 and the first and second impurity region 505 and 507 is formed on the active region. The transistor may serve as a switch device for operating the phase changeable memory device.

Figure 16:
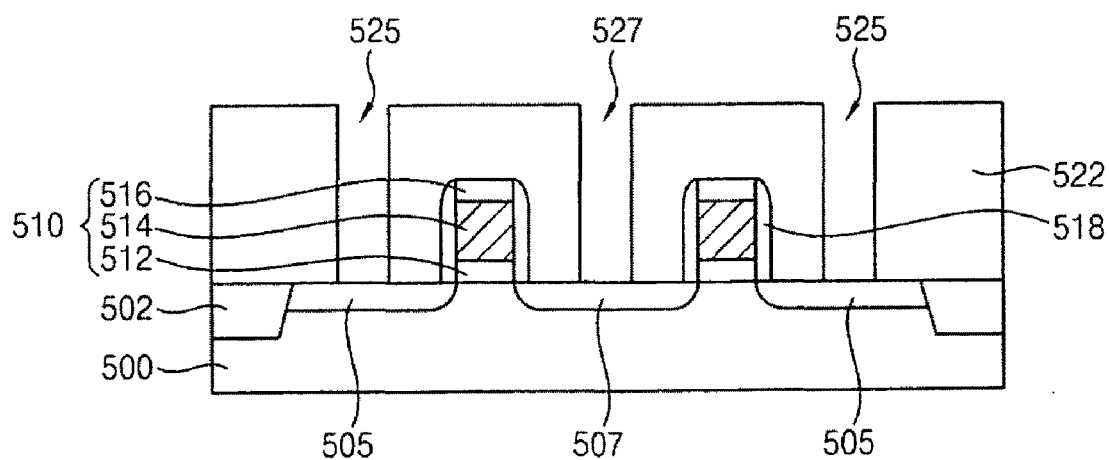

Referring to FIG. 16, a first insulating interlayer 522 is formed on the substrate 500 to cover the transistor. The first insulating interlayer 522 is formed, for example, using BPSG (boro-phosphor silicate glass), PSG (phosphor silicate glass), USG (undoped silicate glass), SOG (spin on glass), FOX (flowable oxide), TEOS (tetra ethyl ortho silicate), PE-TEOS (plasma enhanced-TEOS) or HDP-CVD (high density plasma-chemical vapor deposition) oxide. The first insulating interlayer 522 is formed, for example, by a CVD process, an ALD process, a PVD process, a PECVD process or a LPCVD process.

First and second contact holes 525 and 527 are formed through the first insulating interlayer 522. The first and second contact holes 525 and 527 expose first and second impurity regions 505 and 507, respectively. The first and second contact holes 525 and 527 are formed, for example, by a photolithography process.

Figure 17:
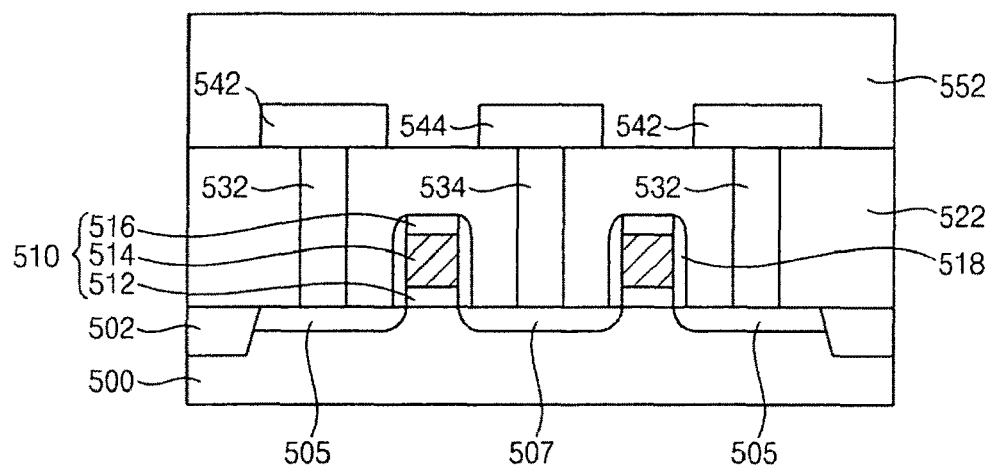

Referring to FIG. 17, the first and second contact holes 525 and 527 are filled with a first conductive layer (not illustrated). The first conductive layer is formed on the first insulating interlayer 522. The first conductive layer includes, for example, metal and/or metal nitride. The first conductive layer is formed, for example by a CVD process, a PVD process, an ALD process, an EBD process and/or a LPD process.

The first conductive layer is removed until the first insulating interlayer 522 is exposed to form first and second contacts 532 and 534 filling the first and second contact holes 525 and 527, respectively. The first and second contacts 532 and 534 are formed on the first and second impurity regions 505 and 507, respectively. The first and second contacts 532 and 534 are formed, for example, by a CMP process and/or an etchback process.

A second conductive layer (not illustrated) is formed on the first and second contacts 532 and 534, and the first insulating interlayer 522. The second conductive layer includes, for example, metal and/or metal nitride. The second conductive layer is formed, for example, by a CVD process, an ALD process, an EBD process or a PLD process. The second conductive layer is patterned to form a pad 542 on the first contact 532 and a first wiring 544 on the second contact 534. The first wiring 544 may include a bit line.

A second insulating interlayer 552 is formed on the first insulating interlayer 522 to cover the pad 542 and the first wiring 544. The second insulating interlayer 552 is formed, for example, using oxide, oxynitride or nitride. The second insulating interlayer 552 is formed, for example, by a CVD process, an ALD process, an EBD process or a PLD process.

Figure 18:
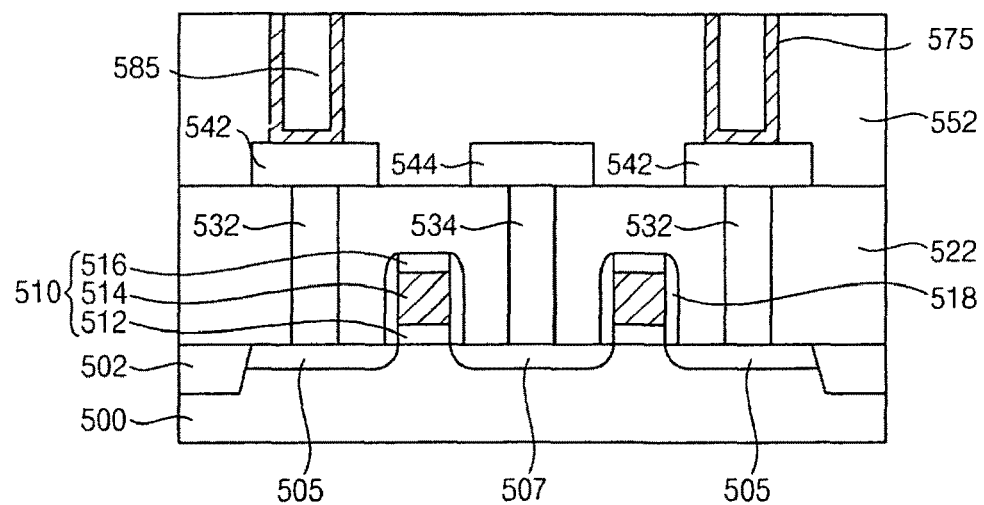

Referring to FIG. 18, an opening (not illustrated) exposing the pad is formed by etching the second insulating interlayer 552. The opening is formed, for example, by a photolithography process.

A lower conductive layer (not illustrated) is formed on the second insulating interlayer 552 and a sidewall of the opening. In an exemplary embodiment, the lower conductive layer has a uniform thickness along the sidewall of the opening, so that the opening is not completely filled with the lower conductive layer. Alternatively, the opening is completely filled with the lower conductive layer. The lower conductive layer is formed, for example, by a CVD process, an ALD process, an EBD process or a PLD process. The lower conductive layer is formed, for example, using doped polysilicon, metal or metal nitride.

The opening is filled with a filling layer (not illustrated). The filling layer is formed, for example, using oxide, nitride or oxynitride. The filling layer is formed, for example, by a CVD process, an ALD process, an EBD process or a PLD process.

When the opening is completely filled with the lower conductive layer, the filling layer is not formed.

The filling layer and the lower conductive layer are removed until the second insulating interlayer 552 is exposed to form a lower electrode 575 and a filling layer pattern 585.

Figure 19:
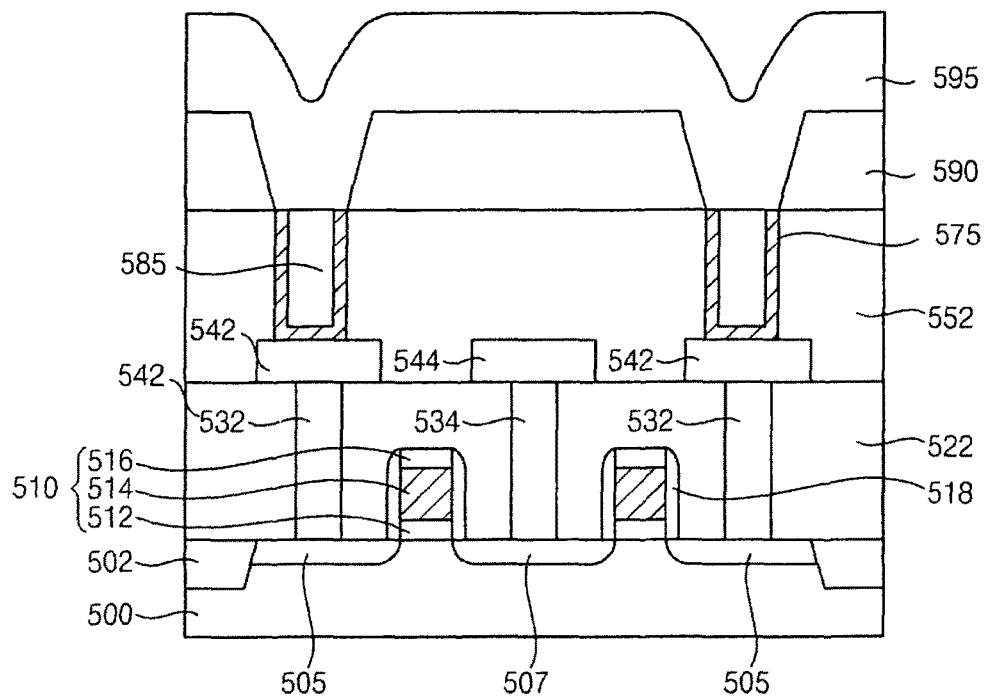

Referring to FIG. 19, a mold layer (not illustrated) is formed on the second insulating interlayer 552 the lower electrode 575 and the filling layer pattern. The mold layer includes, for example, silicon oxide, silicon oxynitride or silicon nitride. The mold layer is patterned to form a mold layer pattern 590 having an opening exposing the lower electrode 575 and the filling layer pattern 585. The opening is formed, for example, by a photolithography process and/or an etching process. The opening has a width gradually decreasing downward.

The opening is filled with a first preliminary phase changeable layer 595. The first preliminary phase changeable layer 595 is formed in the opening and on the mold layer pattern 590. The first preliminary phase changeable layer 595 is formed, for example, using a chalcogenide material including, for example, germanium (Ge), antimony (Sb), and/or tellurium (Te). The first preliminary phase changeable layer 595 is formed, for example, by a physical vapor deposition (PVD) process, a chemical vapor deposition (CVD) process, a sol-gel process, a atomic layer deposition (ALD) process or a cyclic CVD process.

In an exemplary embodiment, the first preliminary phase changeable layer 595 is formed by a PVD process. When the first preliminary phase changeable layer 595 is formed by a PVD process, the first preliminary phase changeable layer 595 has a property better than that formed by a CVD process or an ALD process. The PVD process deposits material on or in a target without chemical reactions, while the CVD process and the ALD process use chemical reactions for deposition. Also, because the opening has a width gradually decreasing downward, a void is not formed in the opening, even when the first preliminary phase changeable layer is formed by a PVD process.

Figure 20:
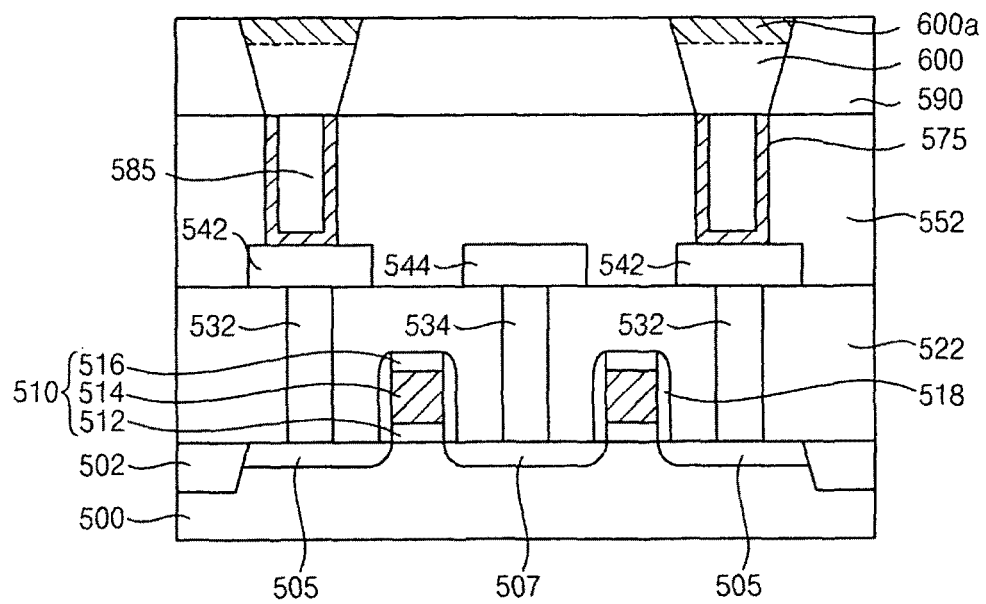

Referring to FIG. 20, an upper portion of the first preliminary phase changeable layer 595 is removed to expose the mold layer pattern 590. Accordingly, a second preliminary phase changeable layer 600 filling the opening is formed.

In an exemplary embodiment, the second preliminary phase changeable layer 600 is formed by a CMP process. The second preliminary phase changeable layer 600 has an upper damaged portion 600a generated by the CMP process. For example, chemical materials may penetrate into an upper portion of a second preliminary phase changeable layer 600 or a polishing agent may give physical damages to the upper portion of a second preliminary phase changeable layer 600 in the CMP process, so that the upper damaged portion 600a is formed. The upper damaged portion 600a deteriorates performance of a device.

Figure 21:
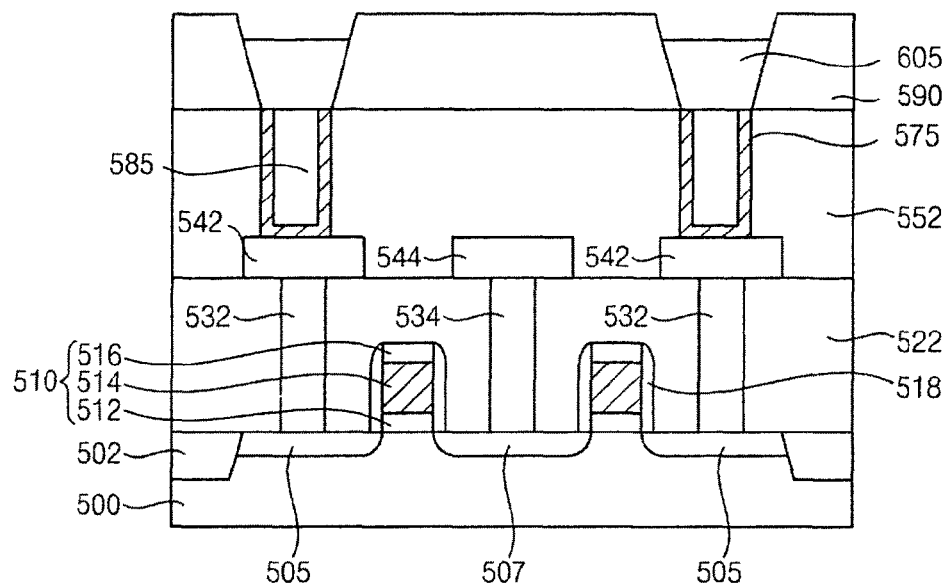

Referring to FIG. 21, the upper damaged portion 600a is removed from the second preliminary phase changeable layer 600 to form a third preliminary phase changeable layer 605. The removal process includes, for example, a dry etching process using plasma. For example, the removal process includes a capacitive coupled plasma (CCP) process, an inductively coupled plasma (ICP) process, a reactive ion etch (RIE) process or an electron cyclotron resonance (ECR) process. In an exemplary embodiment, the upper damaged portion 600a is removed by an etching process using RF power. In an exemplary embodiment, argon gas is injected into a chamber and then the RF power is applied to ionize the argon gas. The argon ion collides against the upper damaged portion 600a, so that the upper damaged portion 600a is removed. In one exemplary embodiment, the removal depth is consistent regardless of a substantial depth of the upper damaged portion 600a. In an alternative embodiment, the removal depth is substantially the same as that of the upper damaged portion 600a.

Figure 22:
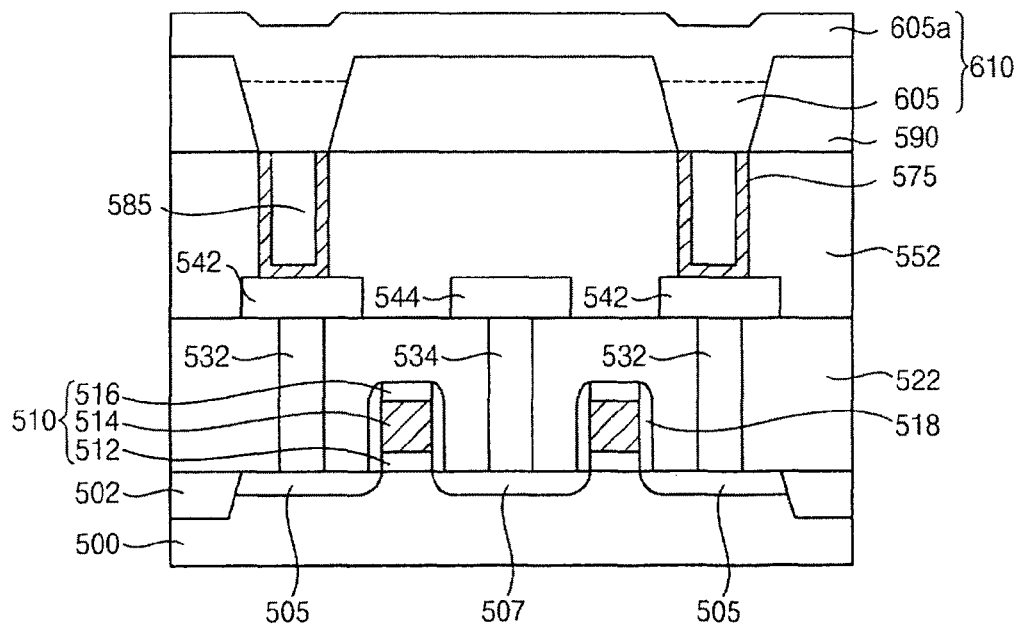

Referring to FIG. 22, a fourth preliminary phase changeable layer 605a is formed on the third preliminary phase changeable layer 605 and the mold layer pattern 590. Accordingly, a phase changeable layer 610 is formed. The fourth preliminary phase changeable layer 605a is formed using chalcogenide material including, for example, germanium (Ge), antimony (Sb), and/or tellurium (Te). The fourth preliminary phase changeable layer 605a is formed, for example, by a physical vapor deposition (PVD) process, a chemical vapor deposition (CVD) process, a sol-gel process, an atomic layer deposition (ALD) process or a cyclic CVD process. Accordingly, the phase changeable layer 610 does not have a damaged portion. In an exemplary embodiment, the fourth preliminary phase changeable layer 605a is formed by a PVD process using material substantially the same as the third preliminary phase changeable layer 605. In one embodiment, an interface does not exist between the fourth preliminary phase changeable layer 605a and the third preliminary phase changeable layer 605. In this embodiment, the phase changeable layer 610 has a single body.

The fourth preliminary phase changeable layer 605a prevents heat from being emitted from an area of the phase changeable layer 610 where a phase transition occurs to the outside. When the upper damaged portion 600a is removed and the fourth preliminary phase changeable layer 605a is not formed on the third preliminary phase changeable layer 605, the area of the phase changeable layer 610 where a phase transition occurs (hereinafter, a program area) and an enclosing portion enclosing the program area has decreased volume. As a result, joule's heat converting states of the phase changeable layer 610 is quickly emitted to the outside, so that a reset current is increased. Meanwhile, in an exemplary embodiment, the fourth preliminary phase changeable layer 605a is formed on the upper damaged portion 600a to obtain a sufficient volume of an insulation region insulating heat of the program region. Accordingly, when a phase transition occurs in the program region, heat is not emitted to the outside and is held in the phase changeable layer 610, so that a reset current is reduced.

Figure 23:
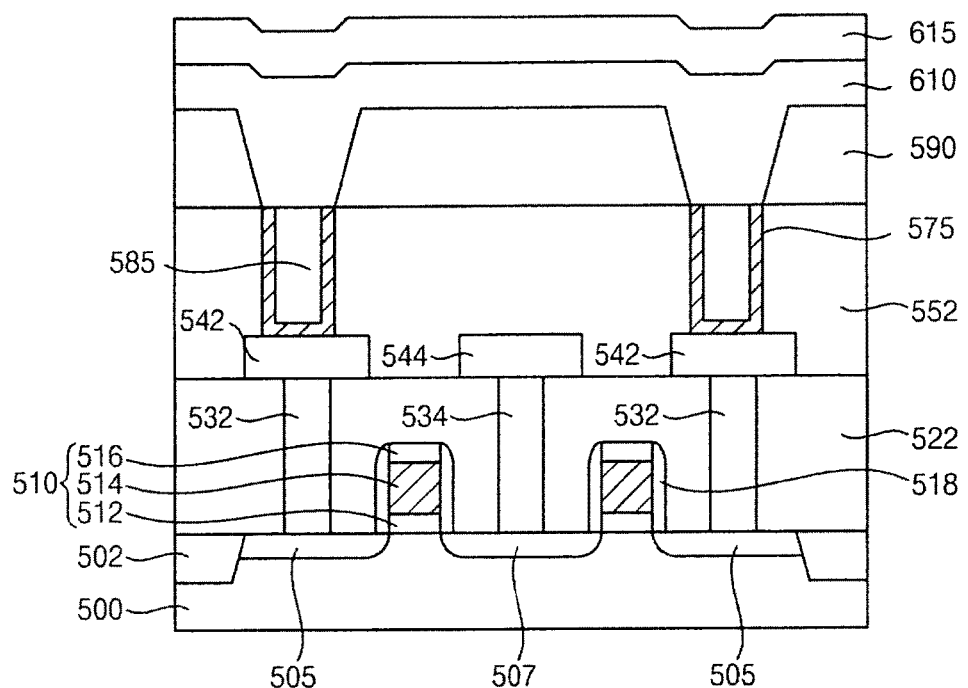

Referring to FIG. 23, an upper electrode layer 615 is formed on the phase changeable layer 610. The upper electrode layer 615 is formed, for example, using metal and/or conductive metal nitride by a sputtering process, a CVD process, a PECVD process, an ALD process or a PLD process. For example, the upper electrode layer 615 includes titanium, nickel, zirconium, molybdenum, ruthenium, palladium, hafnium, tantalum, iridium, platinum, titanium nitride, nickel nitride, zirconium nitride, molybdenum nitride, ruthenium nitride, palladium nitride, hafnium nitride, tantalum nitride, iridium nitride, platinum nitride, tungsten nitride, aluminum nitride, niobium nitride, titanium silicon nitride, titanium aluminum nitride, titanium boron nitride, zirconium silicon nitride, molybdenum aluminum nitride, molybdenum silicon nitride, tantalum silicon molybdenum and/or tantalum aluminum nitride. These may be used alone or in combination.

Figure 24:
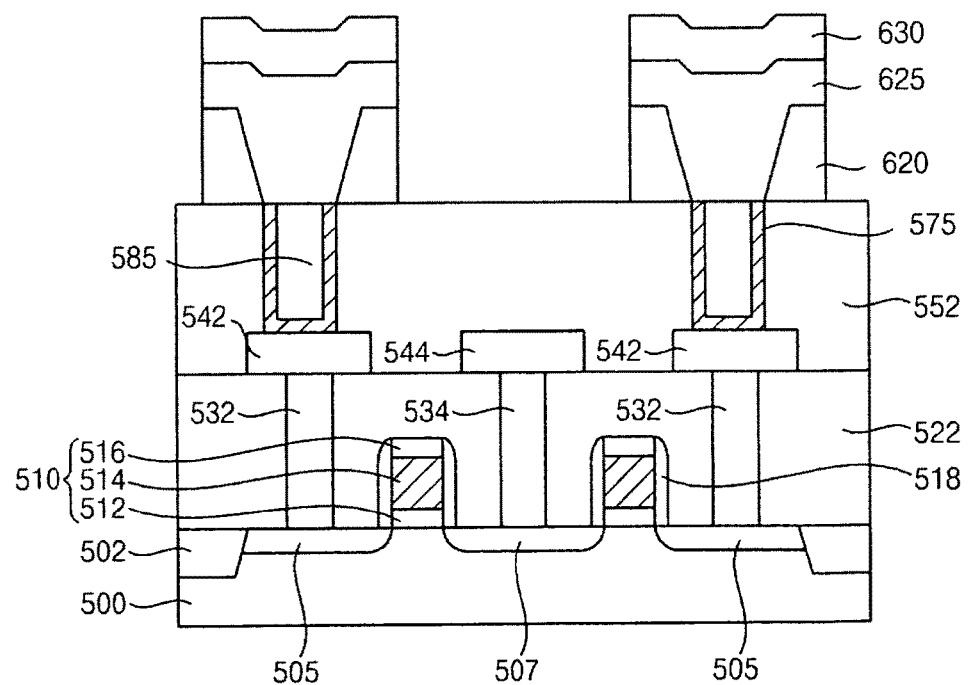

Referring to FIG. 24, the upper electrode layer 615, the phase changeable layer 610 and the mold layer pattern 590 are patterned to form an upper electrode 630, a phase changeable layer pattern 625 and a mold pattern 620.

An upper portion of the phase changeable layer pattern 625 extends across a top portion of the mold pattern 620. The phase changeable layer pattern 625 has an upper portion having a width substantially larger than that of the opening. The upper portion prevents impurities from being diffused into the phase changeable layer pattern 625 when the upper electrode layer 615 and the phase changeable layer 610 are patterned.

That is, the phase changeable layer pattern 610 covers a corner portion where the opening and the mold pattern 620 contact each other. Accordingly, an etch margin is enhanced.

Figure 25:
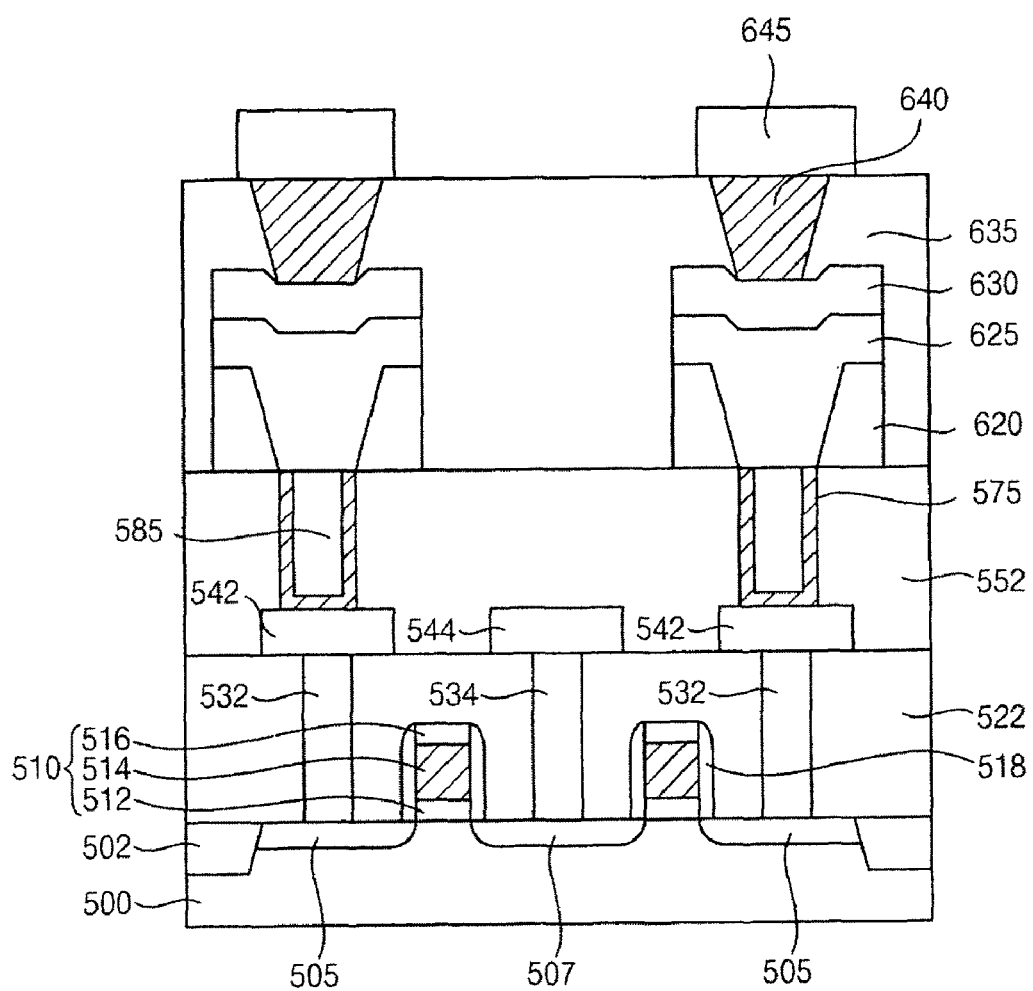

Referring to FIG. 25, an insulating interlayer (not illustrated) is formed to cover the upper electrode 630, the phase changeable layer pattern 625 and the mold pattern 620. The insulating interlayer is formed, for example, using oxide, nitride and/or oxynitride. The insulating interlayer is formed, for example, by a CVD process, a PECVD process, an ALD process, a HDP-CVD process or a LPCVD process.

The insulating interlayer is partially etched to form an insulating interlayer pattern 635. The insulating interlayer pattern 635 includes an upper contact hole exposing the upper electrode 630. The contact hole is filled with an upper contact 640. A wiring 645 is formed on the upper contact 640 and the insulating interlayer pattern 635. The wiring 645 and the upper contact 640 are formed, for example, using metal, conductive metal nitride and/or doped polysilicon. The wiring 645 and the upper contact 640 are formed, for example, by a CVD process, a PECVD process, an ALD process, a HDP-CVD process or a LPCVD process.

FIGS. 26 through 35 are cross-sectional views illustrating a phase changeable memory device in accordance with exemplary embodiments of the present inventive concept. The phase changeable memory device has a phase changeable memory unit substantially the same as or similar to that in FIG. 1. However, the phase changeable memory device is not limited to the phase changeable memory unit.

Figure 26:
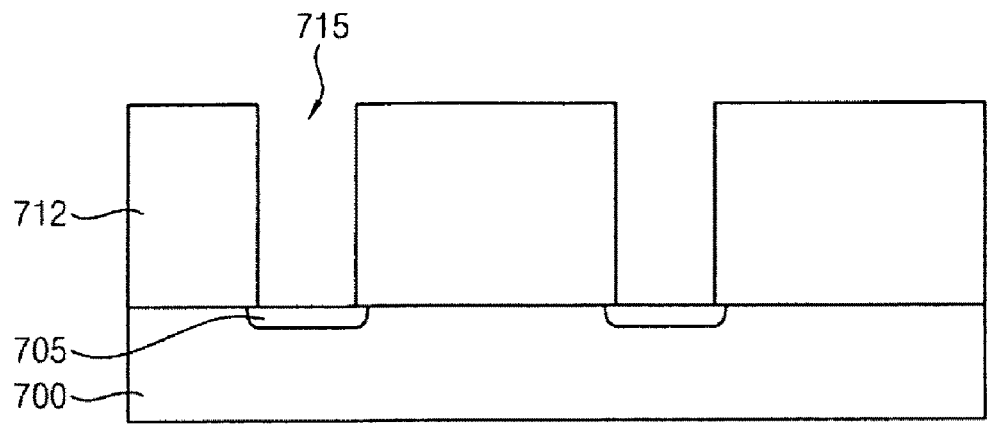
FIGS. 26 through 35 are cross-sectional views illustrating a phase changeable memory device in accordance with exemplary embodiments of the present inventive concept.

Referring to FIG. 26, a lower structure including an impurity region 705 is formed on a substrate 700. A first insulating interlayer 712 is formed on the substrate 700 to cover the lower structure. The first insulating interlayer 712 is formed, for example, using oxide, nitride and/or oxynitride. The first insulating interlayer 712 is formed, for example, by a CVD process, a PECVD process, an ALD process, a HDP-CVD process or a LPCVD process.

An opening 715 exposing the impurity region 705 is formed through the first insulating interlayer 712. The opening may be formed by a photolithography process.

Figure 27:
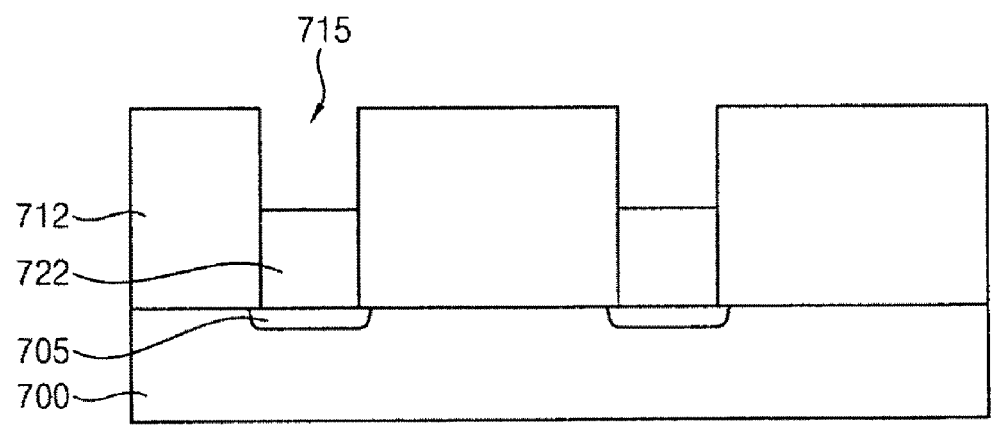

Referring to FIG. 27, the opening 715 is filled with a lower conductive layer. The lower conductive layer is formed, for example, using the exposed impurity region 705 as a seed. An upper portion of the lower conductive layer is partially etched to form a lower conductive layer pattern 722. The lower conductive layer pattern 722 partially fills the opening 715. The lower conductive layer pattern 722 is formed by a selective epitaxial growth (SEG) process. The lower conductive layer pattern 722 includes, for example, silicon when the lower conductive layer pattern is formed from the impurity region 705.

Figure 28:
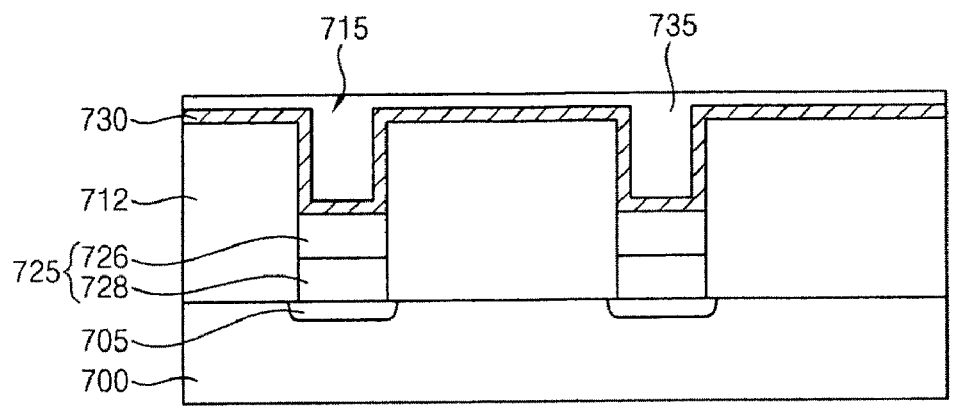

Referring to FIG. 28, impurities are implanted into the lower conductive layer pattern 722 to form a conductive layer (725) including a first conductive layer 728 and a second conductive layer 726. The first conductive layer 728 and the second conductive layer 726 may be formed from the lower conductive layer pattern 722. Impurities implanted into the first conductive layer 728 may be different from that implanted into the second conductive layer 726.

A lower electrode layer 730 having a uniform thickness is formed along the second conductive layer 726, a sidewall of the opening 715 and the first insulating interlayer 712. In an exemplary embodiment, the lower electrode layer 730 is formed using silicon doped with impurities. For example, the lower electrode layer 730 is formed using polysilicon doped with impurities, amorphous silicon doped with impurities or single crystalline silicon doped with impurities. The opening 715 is filled with a filling layer 735. The filling layer 735 is formed, for example, using oxide, nitride or oxynitride. The filling layer 735 is formed, for example, by a CVD process, a PECVD process, an ALD process, a HDP-CVD process or a LPCVD process.

Alternatively, in an example embodiment, when the lower electrode layer 730 fills up the opening 715, the filling layer 735 is not formed.

Figure 29:
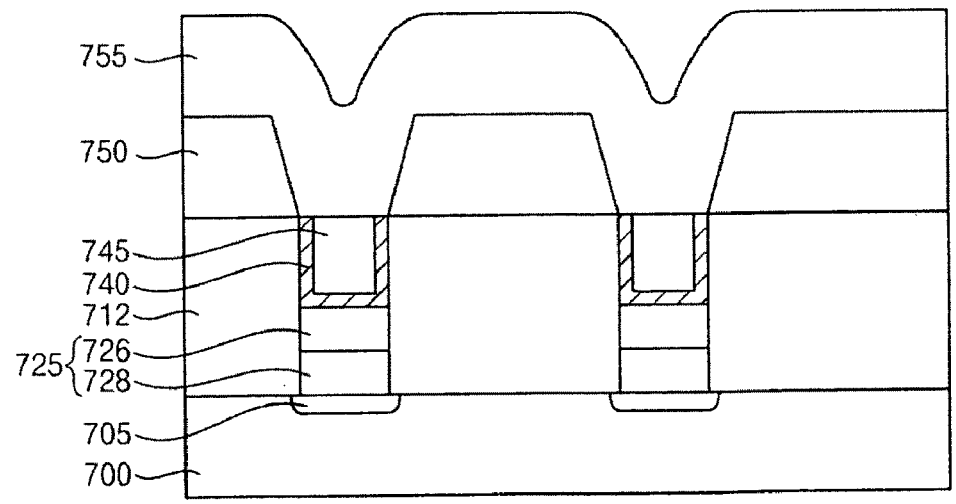

Referring to FIG. 29, the filling layer 735 and the lower electrode layer 730 are removed until the first insulating interlayer 712 is exposed, so that a lower electrode 740 and a filling layer pattern 745 are formed in the opening 715. A mold layer (not illustrated) is formed on the first insulating interlayer 712, the lower electrode 740 and the filling layer pattern 745. The mold layer is formed, for example, using a silicon oxide layer, a silicon nitride layer or a silicon oxynitride layer. The mold layer is patterned to form a mold layer pattern 750 having an opening (not illustrated) exposing the lower electrode 740 and the filling layer pattern 745. The opening is formed, for example, by a photolithography process and/or an etching process. The opening has a width gradually decreasing downward.

The opening is filled with a first preliminary phase changeable layer 755. The first preliminary phase changeable layer 755 is formed in the opening and on the mold layer pattern 750. The first preliminary phase changeable layer 755 is formed, for example, using a chalcogenide material including, for example, germanium (Ge), antimony (Sb), and/or tellurium (Te). The first preliminary phase changeable layer 755 is formed, for example, by a physical vapor deposition (PVD) process, a chemical vapor deposition (CVD) process, a sol-gel process, a atomic layer deposition (ALD) process or a cyclic CVD process. In an exemplary embodiment, the first preliminary phase changeable layer 755 is formed by a PVD process. When the first preliminary phase changeable layer 755 is formed by a PVD process, the first preliminary phase changeable layer 755 has a property better than that formed by a CVD process or an ALD process. The PVD process deposits material on or in a target without chemical reactions, while the CVD process and the ALD process use chemical reactions for deposition. Also, because the opening has a width gradually decreasing downward, a void is not formed in the opening, even when the first preliminary phase changeable layer is formed by a PVD process.

Figure 30:
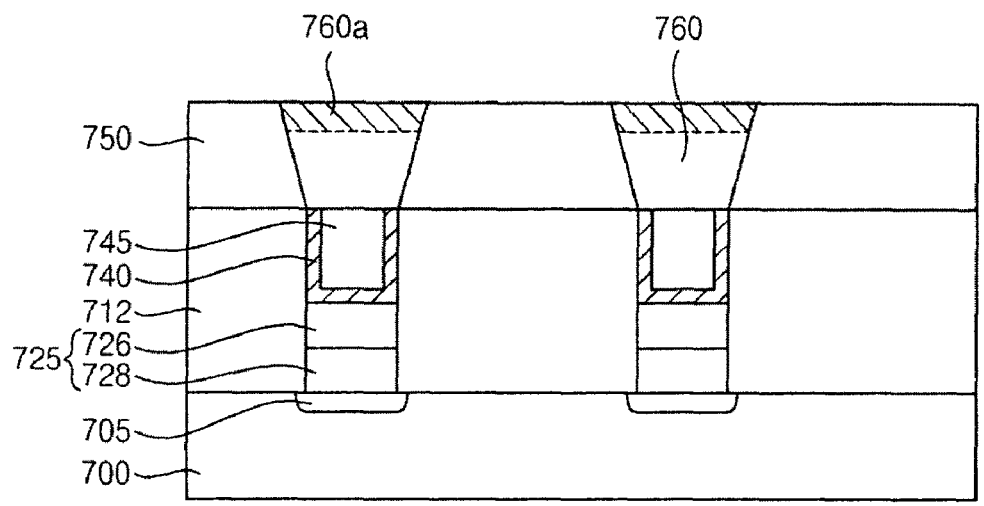

Referring to FIG. 30, an upper portion of the first preliminary phase changeable layer 755 is removed to expose the mold layer pattern 750. Accordingly, a second preliminary phase changeable layer 760 filling the opening is formed in the opening.

In an exemplary embodiment, the second preliminary phase changeable layer 760 is formed by a CMP process. The second preliminary phase changeable layer 760 has an upper damaged portion 760a generated by the CMP process. For example, chemical materials may penetrate into an upper portion of a second preliminary phase changeable layer 760 or a polishing agent may give physical damages to the upper portion of a second preliminary phase changeable layer 760 in the CMP process, so that the upper damaged portion 760a is formed. The upper damaged portion 760a deteriorates performance of a device.

Figure 31:
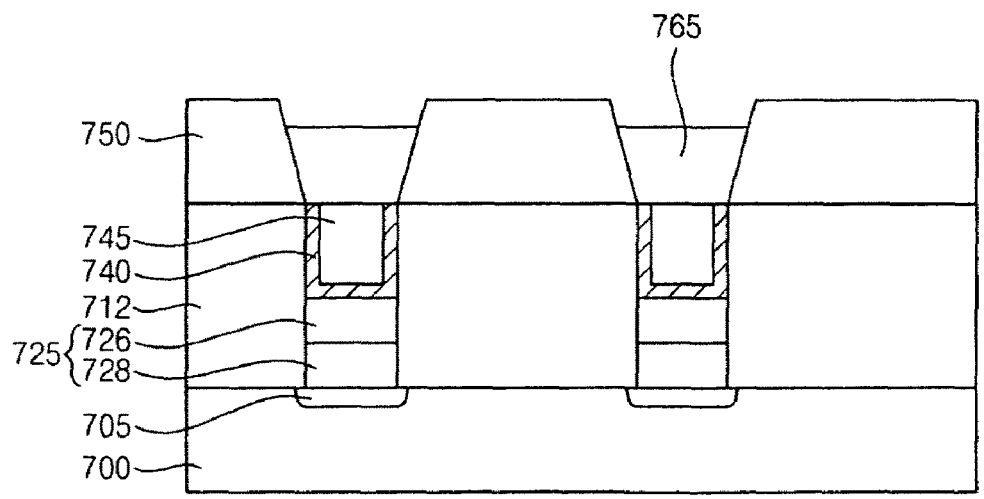

Referring to FIG. 31, the upper damaged portion 760a may be removed from the second preliminary phase changeable layer 760 to form a third preliminary phase changeable layer 765. In an exemplary embodiment, the upper damaged portion 760a is removed by an etching process using RF power. In an exemplary embodiment, argon gas is injected into a chamber and then the RF power is applied to ionize the argon gas. The argon ion collides against the upper damaged portion 760a, so that the upper damaged portion 760a is removed. In one exemplary embodiment, the removal depth is consistent regardless of a substantial depth of the upper damaged portion 760a. In an alternative embodiment, the removal depth is substantially the same as that of the upper damaged portion 760a.

Figure 32:
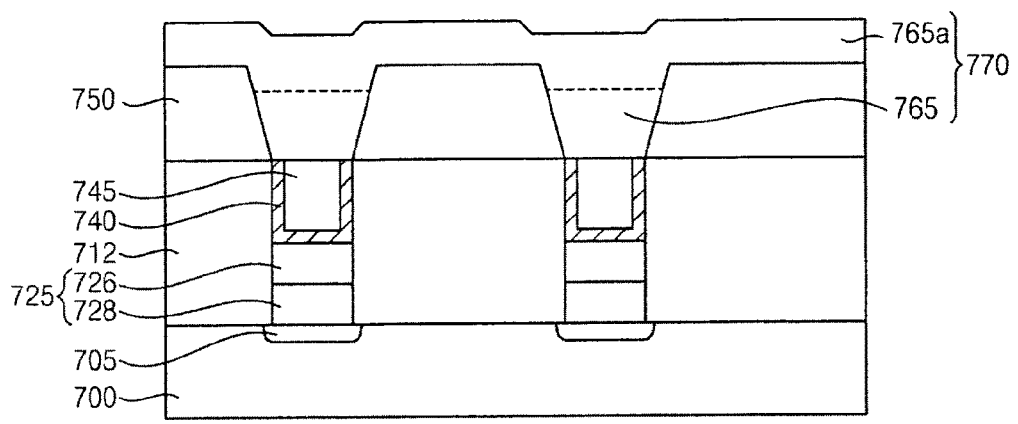

Referring to FIG. 32, a fourth preliminary phase changeable layer 765a is formed on the third preliminary phase changeable layer 765 and the mold layer pattern 750. Accordingly, a phase changeable layer 770 is formed.

The fourth preliminary phase changeable layer 765a is formed, for example, using a chalcogenide material including, for example, germanium (Ge), antimony (Sb), and/or tellurium (Te). The fourth preliminary phase changeable layer 765a is formed, for example, by a physical vapor deposition (PVD) process, a chemical vapor deposition (CVD) process, a sol-gel process, an atomic layer deposition (ALD) process or a cyclic CVD process. Accordingly, the phase changeable layer 770 does not have a damaged portion. In an exemplary embodiment, the fourth preliminary phase changeable layer 765a is formed by a PVD process using material substantially the same as the third preliminary phase changeable layer 765. In one exemplary embodiment, an interface does not exist between the fourth preliminary phase changeable layer 765a and the third preliminary phase changeable layer 605. In this embodiment, the phase changeable layer 770 is a single body.

The fourth preliminary phase changeable layer 765a prevents heat from being emitted from an area of the phase changeable layer 770 where a phase transition occurs to the outside. When the upper damaged portion 760a is removed and the fourth preliminary phase changeable layer 765a is not formed on the third preliminary phase changeable layer 765, the area of the phase changeable layer 770 where a phase transition occurs (hereinafter, a program area) and an enclosing portion enclosing the program area has decreased volume. As a result, joule's heat converting states of the phase changeable layer 770 is quickly emitted to the outside, so that a reset current is increased. Meanwhile, in an exemplary embodiment, the fourth preliminary phase changeable layer 765a is formed on the upper damaged portion 760a to obtain a sufficient volume of an insulation region insulating heat of the program region. Accordingly, when a phase transition occurs in the program region, heat is not emitted to the outside and is held in the phase changeable layer 770, so that a reset current is reduced.

Figure 33:
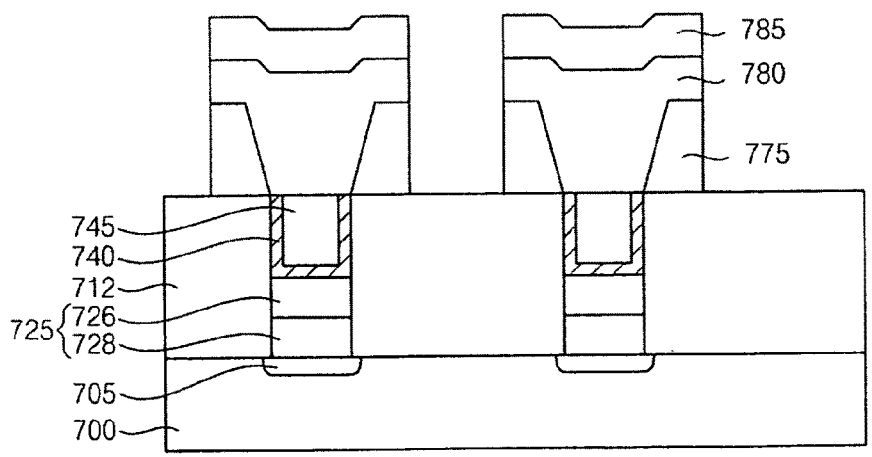

Referring to FIG. 33, an upper electrode layer (not illustrated) is formed on the phase changeable layer 770. The upper electrode layer is formed, for example, using metal and/or conductive metal nitride by a sputtering process, a CVD process, a PECVD process, an ALD process or PLD process. The upper electrode layer, the phase changeable layer 770 and the mold layer pattern 750 are patterned to form a phase changeable memory unit having an upper electrode 785, a phase changeable layer pattern 780 and a mold pattern 775.

Figure 34:
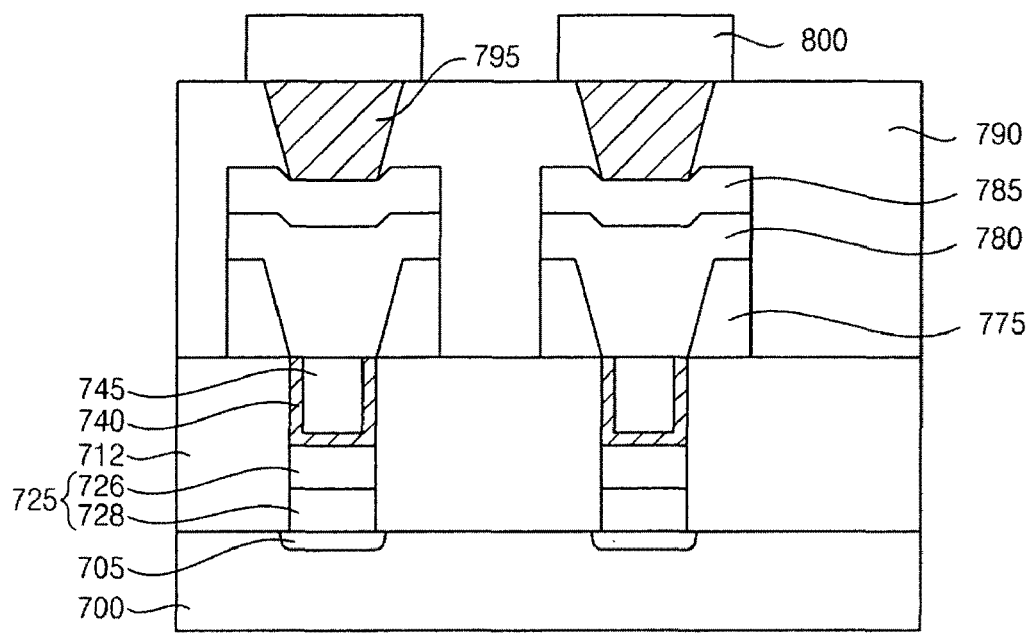

Referring to FIG. 34, a second insulating interlayer (not illustrated) is formed to cover the phase changeable memory unit. The second insulating interlayer is formed, for example, using oxide, nitride and/or oxynitride. The second insulating interlayer is formed, for example, by a CVD process, a PECVD process, an ALD process, a HDP-CVD process or a LPCVD process.

The second insulating interlayer is partially etched to form an insulating interlayer pattern 790. The insulating interlayer pattern 790 includes an upper contact hole exposing the upper electrode 785. The contact hole is filled with an upper contact 795. A wiring 800 is formed on the upper contact 795 and the second insulating interlayer pattern 795. The wiring 800 and the upper contact 795 are formed, for example, using metal, conductive metal nitride and/or doped polysilicon.

Figure 35:
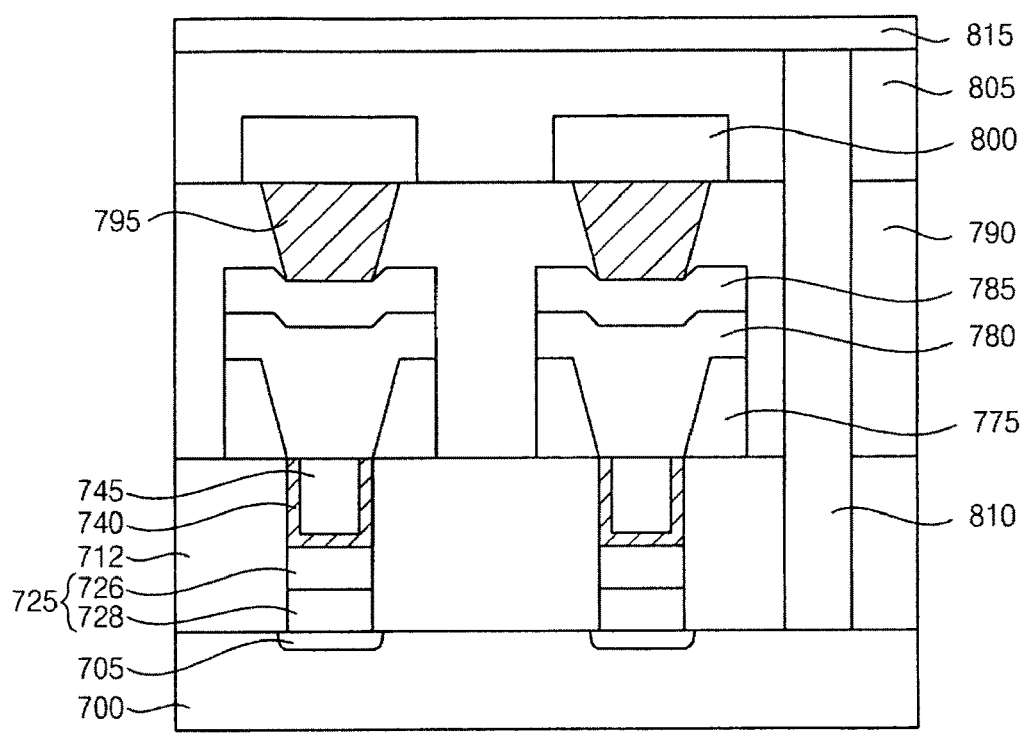

Referring to FIG. 35, a third insulating interlayer 805 is formed on the second insulating interlayer pattern 795 to cover the first wiring 800. A second contact hole (not illustrated) is formed through the third insulating interlayer 805, the second insulating interlayer 790 and the first insulating interlayer 712 to partially expose the substrate 700. The second contact hole is filled with a second contact 810. The second contact 810 is formed, for example, using metal, conductive metal nitride and/or doped polysilicon. The second contact 810 is formed, for example, by a CVD process, a PECVD process, an ALD process, a HDP-CVD process or a LPCVD process.

A second wiring 815 is formed on the second contact 810 and the third insulating interlayer 805. The second wiring 815 is formed, for example, using metal, conductive metal nitride and/or doped polysilicon. The second wiring 815 is formed, for example, by a CVD process, a PECVD process, an ALD process, a HDP-CVD process or a LPCVD process.

Figure 36:
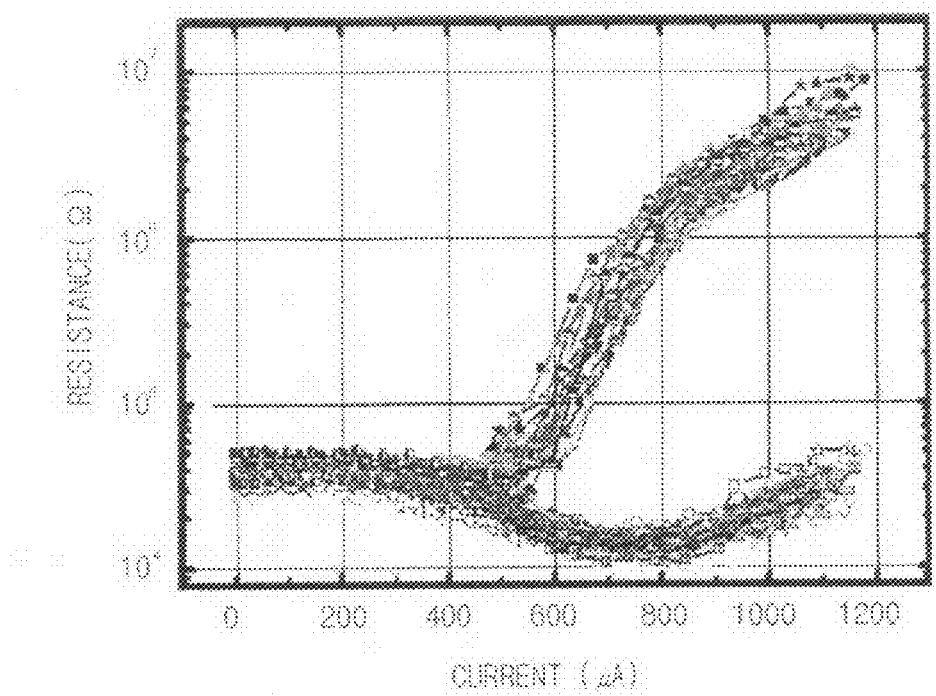
FIG. 36 is an electrical transition graph showing variation of resistance according to a set current and a reset current of a phase changeable memory unit in accordance with a comparative example.
Figure 37:
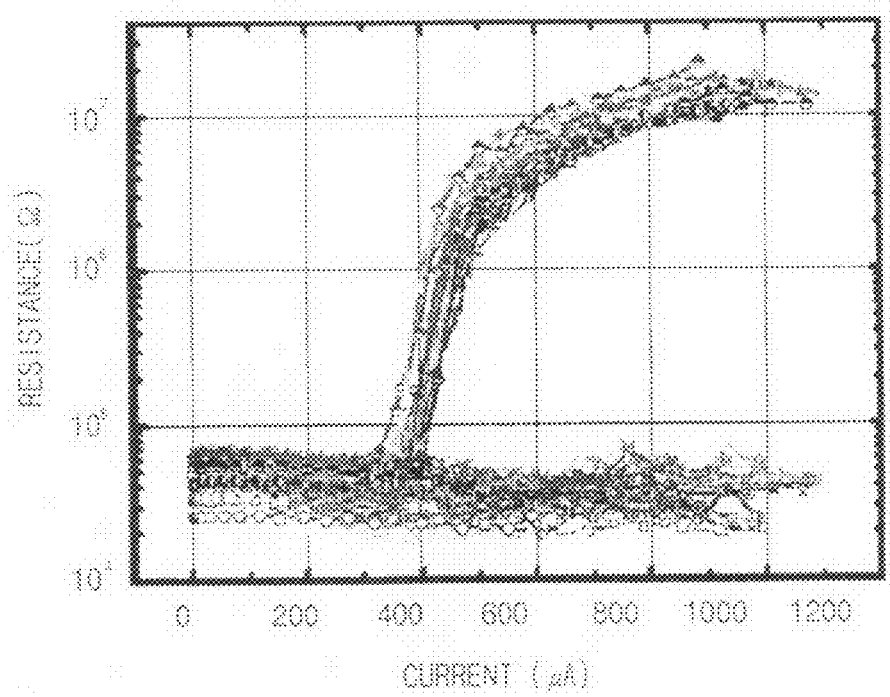
FIG. 37 is an electrical transition graph showing variation of resistance according to a set current and a reset current of a phase changeable memory unit in accordance with an example embodiment of the present inventive concept.

FIG. 36 is an electrical transition graph showing variation of resistance according to a set current and a reset current of a phase changeable memory unit in accordance with a comparative example. FIG. 37 is an electrical transition graph showing variation of resistance according to a set current and a reset current of a phase changeable memory unit in accordance with an example embodiment of the present inventive concept.

The phase changeable memory unit in accordance with a comparative example was formed using the following processes. An insulation layer pattern having an opening exposing a lower electrode contact was formed on the lower electrode contact. The opening was filled with phase changeable material and the phase changeable material covered the insulation layer pattern. The phase changeable material was polished by a CMP process until the insulation layer pattern was exposed.

The phase changeable memory unit in accordance with an example embodiment of the present inventive concept was formed using the following processes. An insulation layer pattern having an opening exposing a lower electrode contact is formed on the lower electrode contact. The opening had a width gradually decreasing downward. The opening was filled with phase changeable material by a PVD process. The phase changeable material covered the insulation layer pattern. The phase changeable material was planarized until an upper face of the phase changeable material was exposed. An upper portion of the planarized phase changeable material was removed by an RF etching process using argon gas. Second phase changeable material was deposited on the etched phase changeable material. The second phase changeable material had an upper face higher than that of the insulation layer pattern.

Resistance acceding to current applied to the phase changeable material of the comparative example and the example embodiment of the present inventive concept was measured, respectively and the results were illustrated in FIGS. 36 and 37.

Referring to FIG. 36, the phase changeable memory unit according to the comparative example had a about 1 MΩ when about 800 μA was applied to the phase changeable memory unit. Meanwhile, the phase changeable memory unit according to the example embodiment of the present inventive concept had a about 1 MΩ when about 500 μA was applied to the phase changeable memory unit. That is, the phase changeable memory unit according to the example embodiment of the present inventive concept had a smaller reset current for converting a state of a phase changeable material into an amorphous state.

According to an example embodiment, an operation current is reduced. Also, an area where an upper electrode and a phase changeable material contact each other is sufficiently obtained. Accordingly, a contact problem is reduced.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing the phase changeable memory unit comprising:
   forming a lower electrode on a substrate;
   forming an insulating interlayer structure having an opening on the lower electrode and the substrate, the opening exposing the lower electrode;
   filling the opening with a phase changeable material layer to partially cover an upper face of the insulating interlayer structure; and
   forming an upper electrode on the phase changeable material layer,
   wherein filling the opening with the phase changeable material layer comprises:
      forming a first phase changeable material layer in the opening and on the insulating interlayer structure;
      planarizing the first phase changeable material layer to form a second phase changeable material layer until the upper face of the insulating interlayer structure is exposed;
      removing an upper portion of the second phase changeable material layer; and
      forming a third phase changeable material layer on the second phase changeable material layer.

2. A method of manufacturing the phase changeable memory unit comprising:
   forming a lower electrode on a substrate;
   forming an insulating interlayer structure having an opening on the lower electrode and the substrate, the opening exposing the lower electrode;
   filling the opening with a phase changeable material layer to partially cover an upper face of the insulating interlayer structure; and
   forming an upper electrode on the phase changeable material layer,
   wherein filling the opening with the phase changeable material layer comprises:
      forming a first phase changeable material layer having a uniform thickness along a surface of the insulating interlayer structure and a surface and a sidewall of the opening;
      planarizing the first phase changeable material layer to form a second phase changeable material layer until the upper face of the insulating interlayer structure is exposed;
      removing an upper portion of the second phase changeable material layer; and
      forming a third phase changeable material layer on the second phase changeable material layer.

3. The method of claim 1, wherein forming the first phase changeable material layer includes a physical vapor deposition process.

4. The method of claim 1, wherein removing the upper portion of the second phase changeable material layer includes an RF etching process using an argon gas.

5. The method of claim 1, wherein planarizing the first phase changeable material layer damages the upper portion of the second phase changeable material layer and removing the upper portion of the second phase changeable material layer removes the damaged upper portion.

6. The method of claim 1, wherein removing the upper portion of the second phase changeable material layer removes about 100 Å to about 200 Å of the upper portion of the second phase changeable material layer.

7. The method of claim 1, wherein forming the third phase changeable material layer includes a physical vapor deposition process which forms the third phase changeable material layer on the second phase changeable material layer and the insulating interlayer structure.

8. The method of claim 1, wherein the opening has a width gradually decreasing downward.

9. A method of manufacturing the phase changeable memory unit comprising:

forming a lower electrode on a substrate;

forming an insulating interlayer structure having an opening on the lower electrode and the substrate, the opening exposing the lower electrode;

filling the opening with a phase changeable material layer to partially cover an upper face of the insulating interlayer structure; and forming an upper electrode on the phase changeable material layer, wherein the opening has a width gradually decreasing downward.

* * * * *